US009362496B2

(12) United States Patent
Walls et al.

(10) Patent No.: US 9,362,496 B2
(45) Date of Patent: Jun. 7, 2016

(54) RESISTIVE MEMORY CELL WITH TRENCH-SHAPED BOTTOM ELECTRODE

(71) Applicant: Microchip Technology Incorporated, Chandler, AZ (US)

(72) Inventors: James Walls, Mesa, AZ (US); Paul Fest, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/183,738

(22) Filed: Feb. 19, 2014

(65) Prior Publication Data

US 2014/0264246 A1    Sep. 18, 2014

Related U.S. Application Data

(60) Provisional application No. 61/780,187, filed on Mar. 13, 2013.

(51) Int. Cl.
*H01L 47/00* (2006.01)
*H01L 45/00* (2006.01)
*H01L 27/24* (2006.01)

(52) U.S. Cl.
CPC ........ *H01L 45/1253* (2013.01); *H01L 27/2463* (2013.01); *H01L 45/08* (2013.01); *H01L 45/085* (2013.01); *H01L 45/124* (2013.01); *H01L 45/1233* (2013.01); *H01L 45/1273* (2013.01); *H01L 45/142* (2013.01); *H01L 45/145* (2013.01); *H01L 45/146* (2013.01); *H01L 45/16* (2013.01)

(58) Field of Classification Search
None
See application file for complete search history.

(56) References Cited

U.S. PATENT DOCUMENTS 5,790,455 A    8/1998  Caywood .................. 635/185.06
5,962,872 A   10/1999  Zhang et al. ..................... 257/66

(Continued)

FOREIGN PATENT DOCUMENTS

CN      102130145 A      7/2011    .............. H01L 27/24
DE   102007049786 A1    4/2009    .............. H01L 27/24

(Continued)

OTHER PUBLICATIONS

International Search Report and Written Opinion, Application No. PCT/US2015/016259, 16 pages, May 6, 2015.

(Continued)

*Primary Examiner* — Evan Pert
*Assistant Examiner* — Shaka White
(74) *Attorney, Agent, or Firm* — Slayden Grubert Beard PLLC

(57) ABSTRACT

A resistive memory cell, e.g., CBRAM or ReRAM cell, may include a top electrode an a trench-shaped bottom electrode structure defining a bottom electrode connection and a sidewall extending from a first sidewall region adjacent the bottom electrode connection to a tip region defining a tip surface facing generally away from the bottom electrode connection, and wherein the tip surface facing away from the bottom electrode connection has a tip thickness that is less than a thickness of the first sidewall region adjacent the bottom electrode connection. An electrolyte switching region is arranged between the top electrode and the bottom electrode sidewall tip region to provide a path for the formation of a conductive filament or vacancy chain from the bottom electrode sidewall tip surface of the top electrode, via the electrolyte switching region, when a voltage bias is applied to the resistive memory cell.

24 Claims, 20 Drawing Sheets

(56) References Cited

U.S. PATENT DOCUMENTS

| | | | | |
|---|---|---|---|---|
| 5,986,931 | A | 11/1999 | Caywood | 365/185.06 |
| 6,031,287 | A | 2/2000 | Harshfield et al. | 257/734 |
| 6,147,395 | A | 11/2000 | Gilgen | 257/529 |
| 6,436,611 | B1 | 8/2002 | Lee | 430/314 |
| 2002/0036931 | A1 | 3/2002 | Lowrey et al. | 365/200 |
| 2002/0039306 | A1 | 4/2002 | Lowrey | 365/100 |
| 2004/0192009 | A1 | 9/2004 | Belyansky et al. | 438/424 |
| 2005/0029505 | A1 | 2/2005 | Lowrey | 257/5 |
| 2006/0006443 | A1* | 1/2006 | Lowrey et al. | 257/296 |
| 2006/0097238 | A1 | 5/2006 | Breuil et al. | 257/4 |
| 2007/0097738 | A1 | 5/2007 | Asano et al. | 365/163 |
| 2007/0267618 | A1 | 11/2007 | Zaidi et al. | 257/2 |
| 2008/0012079 | A1 | 1/2008 | Zaidi | 257/379 |
| 2009/0017591 | A1 | 1/2009 | Cervin-lawry et al. | 438/384 |
| 2009/0026438 | A1 | 1/2009 | Lin | 257/4 |
| 2009/0096568 | A1 | 4/2009 | Hosoi et al. | 338/20 |
| 2009/0200640 | A1 | 8/2009 | Hosoi et al. | 257/536 |
| 2010/0019218 | A1 | 1/2010 | Chung | 257/4 |
| 2010/0084741 | A1 | 4/2010 | Andres et al. | 257/536 |
| 2010/0163829 | A1 | 7/2010 | Wang et al. | 257/3 |
| 2010/0193762 | A1 | 8/2010 | Hsieh et al. | 257/4 |
| 2010/0252798 | A1 | 10/2010 | Sumino | 206/503 |
| 2010/0264396 | A1 | 10/2010 | Lung et al. | 257/3 |
| 2011/0147694 | A1 | 6/2011 | Song et al. | 257/3 |
| 2011/0180775 | A1* | 7/2011 | Lin et al. | 257/4 |
| 2011/0291064 | A1 | 12/2011 | Marsh et al. | 257/4 |
| 2012/0294065 | A1 | 11/2012 | Hong et al. | 365/148 |
| 2012/0313071 | A1* | 12/2012 | Gopalan | 257/4 |
| 2012/0319072 | A1 | 12/2012 | Wei et al. | 257/4 |
| 2013/0001501 | A1 | 1/2013 | Sills | 257/4 |
| 2013/0112936 | A1 | 5/2013 | Wei et al. | 257/4 |
| 2013/0214234 | A1 | 8/2013 | Gopalan et al. | 257/3 |
| 2013/0252431 | A1 | 9/2013 | Chen et al. | 438/702 |
| 2013/0336046 | A1 | 12/2013 | Oh | 365/163 |
| 2014/0264245 | A1 | 9/2014 | Walls et al. | 257/4 |
| 2015/0236255 | A1 | 8/2015 | Fest et al. | 257/3 |
| 2015/0236258 | A1 | 8/2015 | Fest et al. | 257/3 |

FOREIGN PATENT DOCUMENTS

| | | | | |
|---|---|---|---|---|
| EP | 1355365 | A2 | 10/2003 | H01L 27/10 |
| EP | 2202816 | A1 | 6/2010 | H01L 27/24 |
| EP | 2267775 | A2 | 12/2010 | G11C 16/04 |
| EP | 2339585 | A1 | 6/2011 | G11C 16/00 |
| WO | 2012/057772 | A1 | 5/2012 | H01L 21/8247 |
| WO | 2012/167286 | A1 | 12/2012 | G11C 11/34 |
| WO | 2014/164015 | A1 | 10/2014 | H01L 45/00 |

OTHER PUBLICATIONS

International Search Report and Written Opinion, Application No. PCT/US2015/016244, 11 pages, May 7, 2015.

Kozicki, M., "Nanoscale Memory Elements Based on Solid-State Electrolytes," IEEE Transactions on Nano Technology, vol. 4, No. 3, 8 pages, May 2005.

Chen, A., "Non-Volatile Resistive Switching for Advanced Memory Applications," IEDM Technical Digest, 4 pages, 2005.

Balakrishnan, M. et al., "A Low Power Non-Volatile Memory Element Based on Copper in Deposited Silicon Oxide," Non-Volatile Memory Technology Symposium, 7 pages, 2006.

Schindler, C. et al., "Bipolar and Unipolar Resistive Switching in CU-Doped SiO2," IEEE Transactions on Electron Devices, vol. 54, No. 10, 7 pages, 2007.

Chen, A., "Ionic Memories: Status and Challenges," Non-Volatile Memory Technology Symposium, 5 pages, 2008.

Valov, I. et al., "Electrochemical Metallization Memories—Fundamentals, Applications, Prospects," Nanotechnology, vol. 22, No. 25, 22 pages, Jun. 24, 2011.

Jou, S. et al., "Resistance Switching Properties in Cu/Cu—SiO2/TaN Device," Proceeding World Congress on Engineering, vol. 2, 4 pages, Jul. 6, 2011.

Yang, L. et al., "Linear Scaling of Reset Current Down to 22-nm Node for a Novel CuxSiyO RRAM," IEEE Electron Device Letters, vol. 33, No. 1, 3 pages, 2012.

International Search Report and Written Opinion, Application No. PCT/US2015/016268, 9 pages, May 4, 2015.

International Search Report and Written Opinion, Application No. PCT/US2014/020188, 10 pages, May 13, 2014.

International Search Report and Written Opinion, Application No. PCT/US2014/022194, 11 pages, May 16, 2014.

International Search Report and Written Opinion, Application No. PCT/US2014/019868, 10 pages, Jun. 5, 2014.

International Search Report and Written Opinion, Application No. PCT/US2014/019906, 12 pages, Jul. 2, 2014.

U.S. Final Office Action, U.S. Appl. No. 14/184,034, 29 pages, Dec. 16, 2015.

International Search Report and Written Opinion, Application No. PCT/US2015/016334, 11 pages, Dec. 7, 2015.

International Search Report and Written Opinion, Application No. PCT/US2015/016321, 11 pages, Jul. 14, 2015.

U.S. Non-Final Office Action, U.S. Appl. No. 14/184,177, 12 pages, Jun. 19, 2015.

U.S. Non-Final Office Action, U.S. Appl. No. 14/183,792, 23 pages, Jul. 8, 2015.

U.S. Non-Final Office Action, U.S. Appl. No. 14/183,674, 26 pages, Jul. 8, 2015.

U.S. Non-Final Office Action, U.S. Appl. No. 14/183,831, 18 pages, Jul. 9, 2015.

U.S. Non-Final Office Action, U.S. Appl. No. 14/183,953, 27 pages, Jul. 31, 2015.

U.S. Final Office Action, U.S. Appl. No. 14/184,331, 10 pages, Nov. 12, 2015.

U.S. Final Office Action, U.S. Appl. No. 14/183,831, 13 pages, Feb. 2, 2016.

International Search Report and Written Opinion, Application No. PCT/US2015/062758, 12 pages, Mar. 2, 2016.

\* cited by examiner

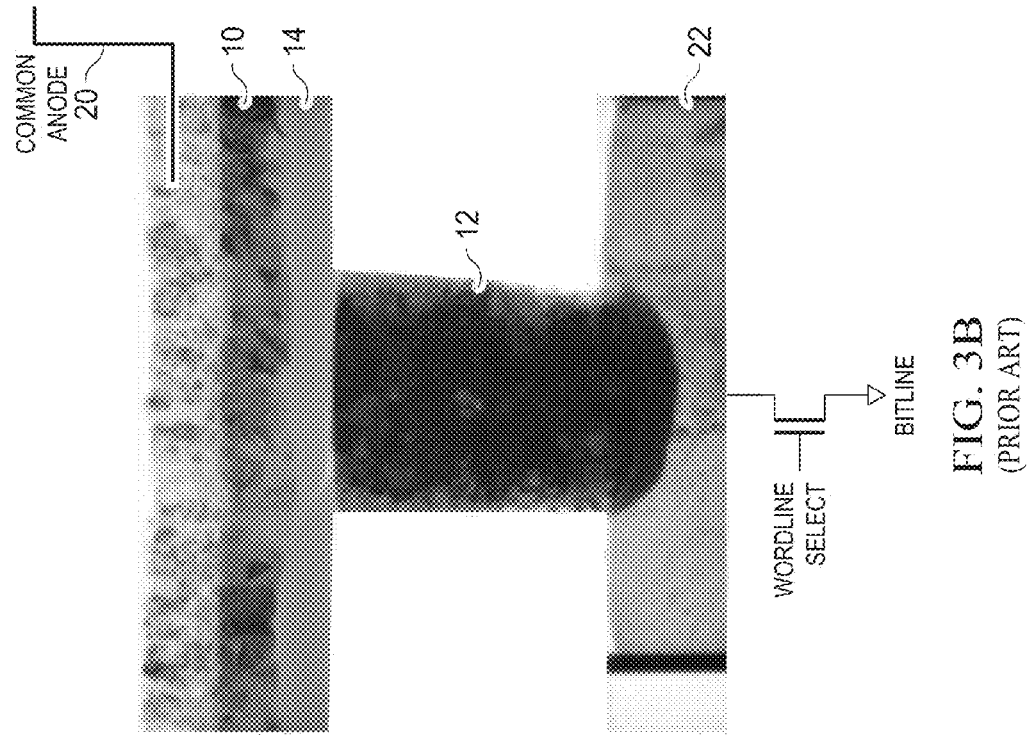
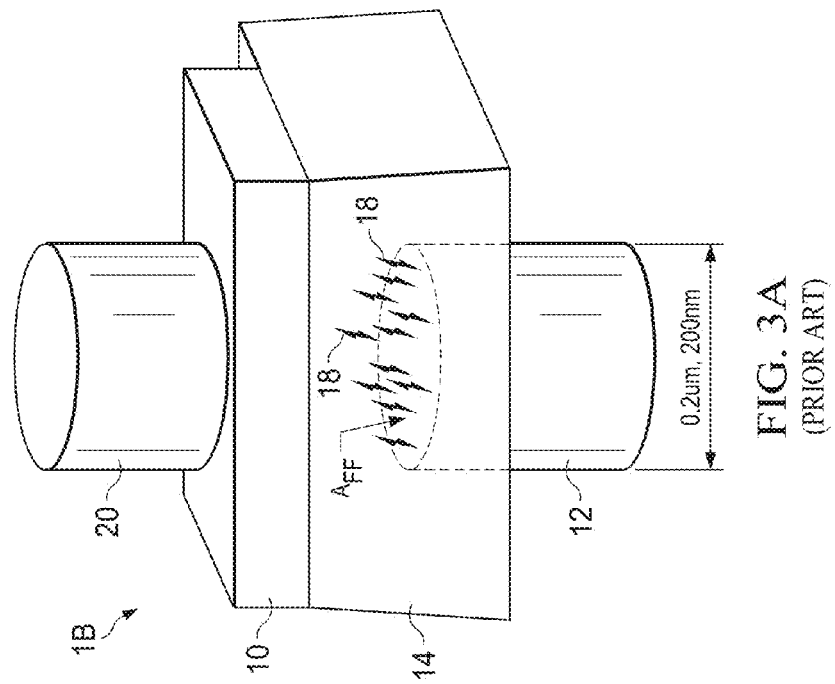
FIG. 3A (PRIOR ART)
FIG. 3B (PRIOR ART)

RESISTIVE MEMORY CELL WITH TRENCH-SHAPED BOTTOM ELECTRODE

RELATED PATENT APPLICATIONS

This application claims the benefit of U.S. Provisional Application No. 61/780,187 filed on Mar. 13, 2013, entitled "TRENCH ELECTRODE FOR CBRAM MEMORY CELL", which is incorporated herein in its entirety

TECHNICAL FIELD

The present disclosure relates to resistive memory cells, e.g., conductive bridging random access memory (CBRAM) or resistive random-access memory (ReRAM) cells, having a trench-shaped bottom electrode.

BACKGROUND

Resistive memory cells, such as conductive bridging memory (CBRAM) and resistive RAM (ReRAM) cells are a new type of non-volatile memory cells that provide scaling and cost advantages over conventional Flash memory cells. A CBRAM is based on the physical re-location of ions within a solid electrolyte. A CBRAM memory cell can be made of two solid metal electrodes, one relatively inert (e.g., tungsten) the other electrochemically active (e.g., silver or copper), separated from each other by a thin layer or film of non-conducting material. The CBRAM cell generates programmable conducting filaments across the non-conducting film through the application of a bias voltage across the non-conducting film. The conducting filaments may be formed by single or very few nanometer-scale ions. The non-conducting film may be referred to as an electrolyte because it provides for the propagation of the conductive filament(s) across the film through an oxidation/reduction process much like in a battery. In a ReRAM cell, the conduction occurs through creation of a vacancy chain in an insulator. The generation of the conductive filament(s)/vacancy-chain(s) creates an on-state (high conduction between the electrodes), while the dissolution of the conductive filament(s)/vacancy-chain(s), e.g., by applying a similar polarity with Joule heating current or an opposite polarity but at smaller currents, reverts the electrolyte/insulator back to its nonconductive off-state. In this disclosure both the electrolyte film, layer, or region of a CBRAM cell and the insulator film, layer, or region of a ReRAM cell are referred to as an "electrolyte," for the sake of simplicity.

A wide range of materials have been demonstrated for possible use in resistive memory cells, both for the electrolyte and the electrodes. One example is the Cu/SiOx based cell in which the Cu is the active metal-source electrode and the SiOx is the electrolyte.

One common problem facing resistive memory cells is the on-state retention, i.e., the ability of the conductive path (filament or vacancy chain) to be stable, especially at the elevated temperatures that the memory parts may typically be qualified to (e.g., 85 C/125 C).

FIG. 1 shows a conventional CBRAM cell 1A, having a top electrode 10 (e.g., copper) arranged over a bottom electrode 12 (e.g., tungsten), with the electrolyte or middle electrode 14 (e.g., $SiO_2$) arranged between the top and bottom electrodes. Conductive filaments 18 propagate from the bottom electrode 12 to the top electrode 10 through the electrolyte 14 when a bias voltage is applied to the cell 1A. This structure has various potential limitations or drawbacks. For example, the effective cross-sectional area for filament formation, which may be referred to as the "confinement zone" or the "filament formation area" indicated as $A_{FF}$, is relatively large and unconfined, making the filament formation area susceptible to extrinsic defects. Also, multi-filament root formation may be likely, due to a relatively large area, which may lead to weaker (less robust) filaments. In general, the larger the ratio between the diameter or width of the filament formation area $A_{FF}$ (indicated by "x") to the filament propagation distance from the bottom electrode 12 to the top electrode 10 (in this case, the thickness of the electrolyte 14, indicated by "y"), the greater the chance of multi-root filament formation. Further, a large electrolyte volume surrounds the filament, which provides diffusion paths for the filament and thus may provide poor retention. Thus, restricting the volume of the electrolyte material in which the conductive path forms may provide a more robust filament due to spatial confinement. The volume of the electrolyte material in which the conductive path forms may be restricted by reducing the area in contact between the bottom electrode 12 and the electrolyte 14.

As used herein, "conductive path" refers a conductive filament (e.g., in a CBRAM cell), vacancy chain (e.g., in an oxygen vacancy based ReRAM cell), or any other type of conductive path for connecting the electrodes of a non-volatile memory cell, typically through an electrolyte layer or region arranged between the electrodes. As used herein the "electrolyte layer" or "electrolyte region" refers to an electrolyte/insulator/memory layer or region between the bottom and top electrodes through which the conductive path propagates.

FIG. 2 shows certain principles of a CBRAM cell formation. Conductive paths 18 may form and grow laterally, or branch into multiple parallel paths. Further, locations of the conductive paths may change with each program/erase cycle. This may contribute to marginal switching performance, variability, high-temp retention issues, and/or poor switching endurance. Restricting switching volume has been shown to benefit the operation. These principles apply equally to ReRAM and CBRAM cells. A key obstacle for adoption of these technologies is switching uniformity.

FIGS. 3A and 3B show a schematic view and an electron microscope image of an example known bottom electrode configuration 1B for a CBRAM cell (e.g., having a one-transistor, one-resistive memory element (1T1R) architecture). In this example, the bottom electrode 12 is a cylindrical via, e.g., a tungsten-filled via with a Ti/TiN liner. A top contact and/or anode 20 may be connected to the top electrode 10 as shown. The bottom electrode 12 may provide a relatively large filament formation area $A_{FF}$ of about 30,000 $nm^2$, for example, which may lead to one or more of the problems or disadvantages discussed above.

SUMMARY

Some embodiments provide resistive memory cells, e.g., CBRAM or ReRAM cells that focus the electric field more precisely than in known cells, which may provide more consistent filament formation, thus improving the consistency of programming voltage and cell predictability. In particular, the bottom electrode of the resistive memory cell may be formed with a trench shape, which may reduce the contact area between the bottom electrode and an electrolyte switching layer or region formed over the bottom electrode, and thus provide a highly focused electric field emanating from the bottom electrode of the cell, as compared with certain conventional designs. As used herein, "trench" may refer to (a) an elongated trench shape (e.g., as shown in FIGS. 4-10C, 13G, and 13I), (b) a via-type shape, e.g., having a rectangular, circular, or any other suitable cross section (e.g., the circular via-type trenches shown in FIG. 13L), or (c) any other shape that may reasonably be considered as a "trench" by one of ordinary skill in the art.

In some embodiments having a trench-style bottom electrode, the filament formation area $A_{FF}$ may be defined by the contact area between the bottom electrode and the electrolyte switching layer.

Trench-style bottom electrodes may be used for select-transistor-addressed configurations as well as passive cross-point array configurations. For example, one embodiment uses a thin refractory trench liner as the bottom electrode cell in a cross-point array. This may provide a reduced filament formation area $A_{FF}$, and may increase predictability of the location of filament formation from the bottom electrode to a respective top electrode, which may limit the scope of the viable switching volume and improve cycling endurance.

In some embodiments, the electrolyte switching layer may be patterned to further reduce the area of contact with the bottom electrode, and thus the filament formation area $A_{FF}$. For example, the switching layer may be formed as a narrow line extending perpendicular to the elongated direction of the trench-style bottom electrode. As another example, the switching layer may be formed as an inverted trench, thus defining two lines extending perpendicular to the trench-style bottom electrode, such that the switching layer contacts the bottom electrode only at small points of intersection between the respective lines of the switching layer and bottom electrode. In such embodiments, the filament formation area may be reduced to sub-lithographic dimensions, e.g., less than 20 nm. In some embodiments, multiple line-style or inverted trench-style switching layers are formed over (and perpendicular to) multiple trench-style bottom electrodes, thus forming a grid or cross-cross pattern defining an array of discrete small filament formation areas.

In some embodiments, a trench-style bottom electrode may be formed with sloped sidewalls that define angled or "pointed" upper edges, which may further reduce the size of the filament formation area.

According to one embodiment, a resistive memory cell comprises a top electrode; a bottom electrode structure having a trench shape and defining a bottom electrode sidewall; and an electrolyte switching region arranged between the top electrode and the bottom electrode sidewall to provide a path for the formation of a conductive filament or vacancy chain from the bottom electrode sidewall to the top electrode when a voltage bias is applied to the resistive memory cell.

According to another embodiment, a memory device comprises an array of resistive memory cells comprising: a top electrode structure; a plurality of bottom electrode structures extending in first direction, each bottom electrode structure having an elongated trench shape defining a pair of spaced-apart bottom electrode sidewalls; and a plurality of electrolyte switching regions extending generally perpendicular to the first direction such that the electrolyte switching regions cross over the bottom electrode sidewalls and define a two-dimensional array of spaced-apart contact areas between the electrolyte switching regions and the bottom electrode sidewalls.

According to another embodiment, a resistive memory cell comprises a top electrode; a bottom electrode structure having a trench shape and defining a bottom electrode connection and a bottom electrode sidewall extending from the bottom electrode connection; wherein the bottom electrode sidewall extends from a first sidewall region adjacent the bottom electrode connection to a tip region defining a tip surface facing generally away from the bottom electrode connection; wherein the first sidewall region adjacent the bottom electrode connection has a first sidewall region thickness in a first direction, and the tip surface facing away from the bottom electrode connection has a tip thickness in the first direction that is less than the first sidewall region thickness; and an electrolyte layer defining an electrolyte switching region arranged between the top electrode and the tip region of the bottom electrode sidewall to provide a path for the formation of a conductive filament or vacancy chain from the tip surface of the bottom electrode sidewall to the top electrode, via the electrolyte switching region, when a voltage bias is applied to the resistive memory cell.

According to another embodiment, a method of forming a resistive memory cell comprises forming a bottom electrode connection; forming a bottom electrode structure having a trench shape by a process including: forming a sidewall support structure over the bottom electrode connection, the sidewall support structure defining a trench shaped opening; depositing a bottom electrode sidewall layer over the sidewall support structure and extending into the trench shaped opening; and etching the bottom electrode sidewall layer to remove portions of the bottom electrode sidewall layer, and to define a bottom electrode sidewall extending from a first sidewall region adjacent the bottom electrode connection to a tip region away from the bottom electrode connection, wherein the etching step provides that the tip surface has a thickness in a first direction that is less than a thickness of the first sidewall region in the first direction; and forming an electrolyte region and a top electrode such that the electrolyte region is arranged between the top electrode and the tip region of the bottom electrode sidewall, the electrolyte region configured to provide a path for the formation of a conductive filament or vacancy chain from the tip surface of the bottom electrode sidewall to the top electrode, via the electrolyte switching region, when a voltage bias is applied to the resistive memory cell.

BRIEF DESCRIPTION OF THE FIGURES

Example embodiments are discussed below with reference to the drawings, in which:

FIGS. 3A and 3B show a schematic view and an electron microscope image of an example known CBRAM cell configuration;

DETAILED DESCRIPTION

Figure 1:
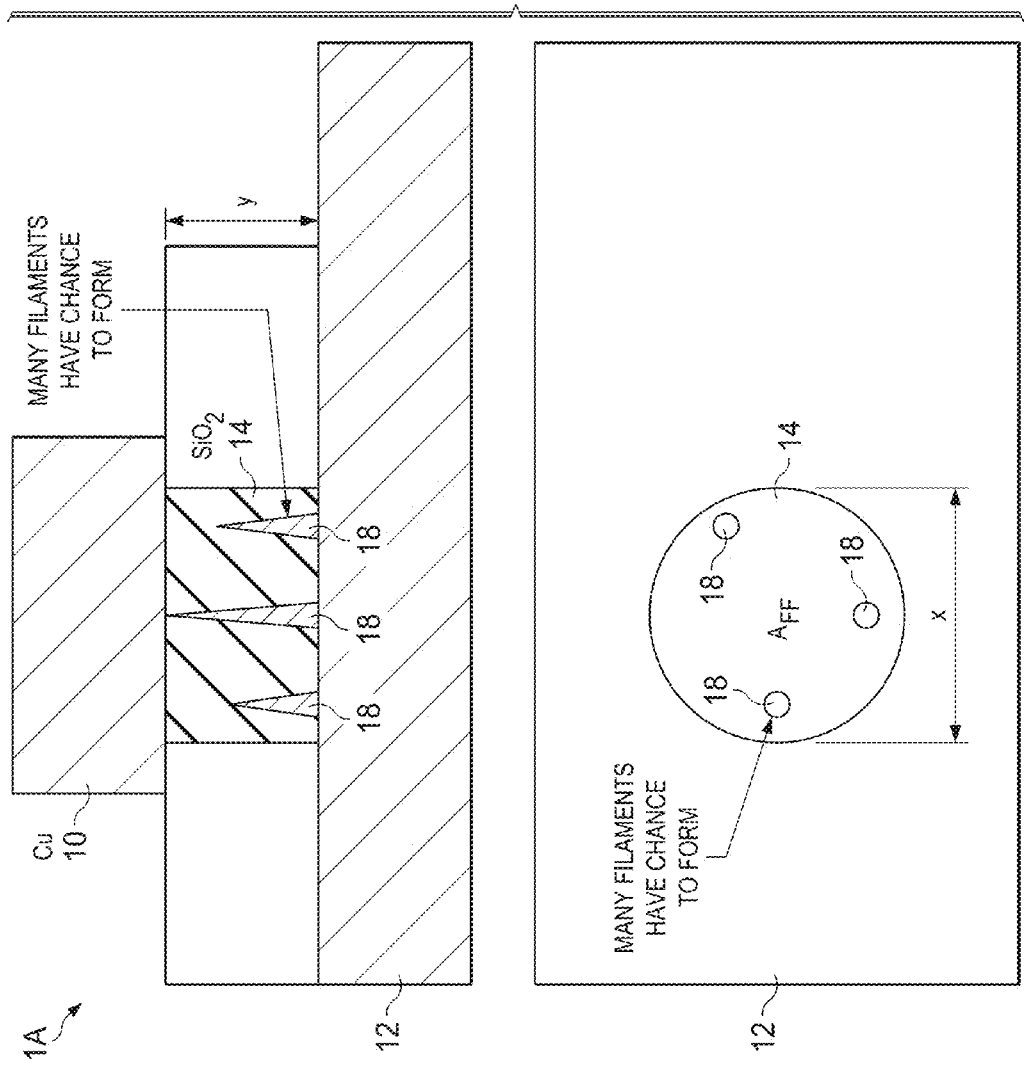
FIG. 1 shows an example conventional CBRAM cell.
Figure 2:
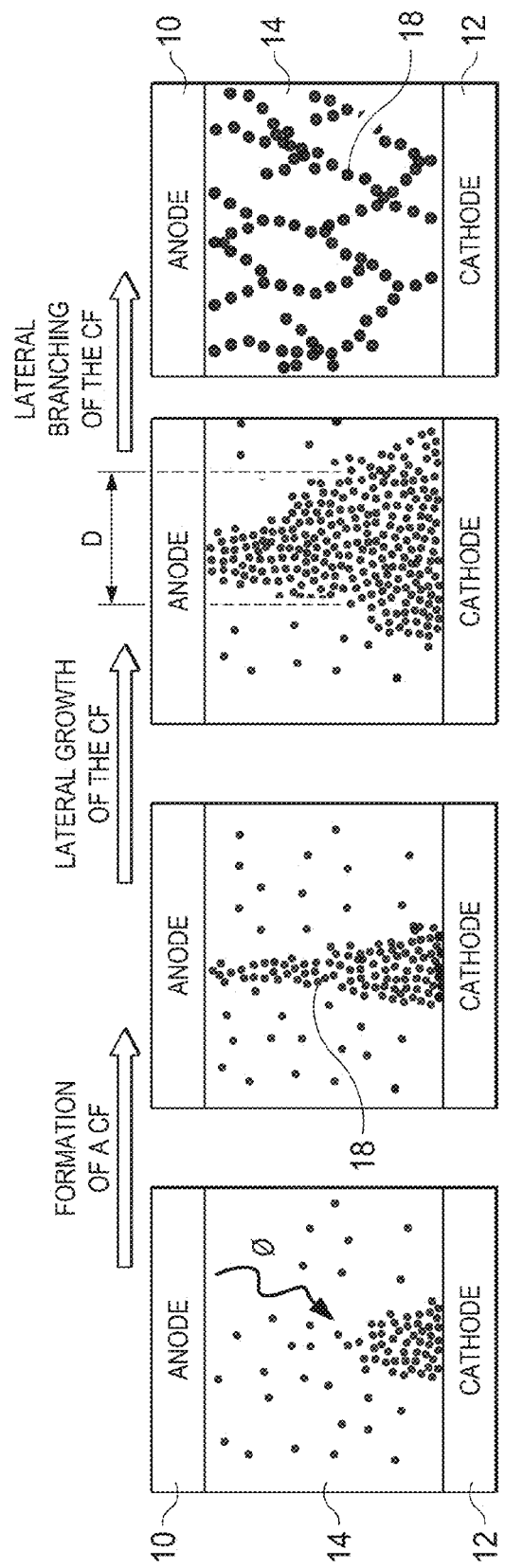
FIG. 2 shows certain principles of CBRAM cell formation.
Figure 4A:
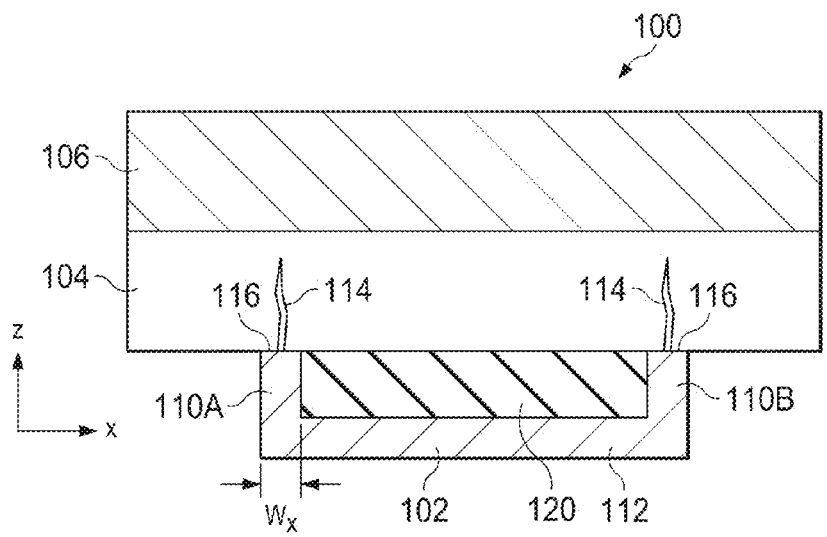
FIGS. 4A and 4B show a cross-sectional view of a resistive memory cell having a trench-style bottom electrode, and a three-dimensional view of the trench-style bottom electrode, respectively, according to example embodiments.
Figure 4B:
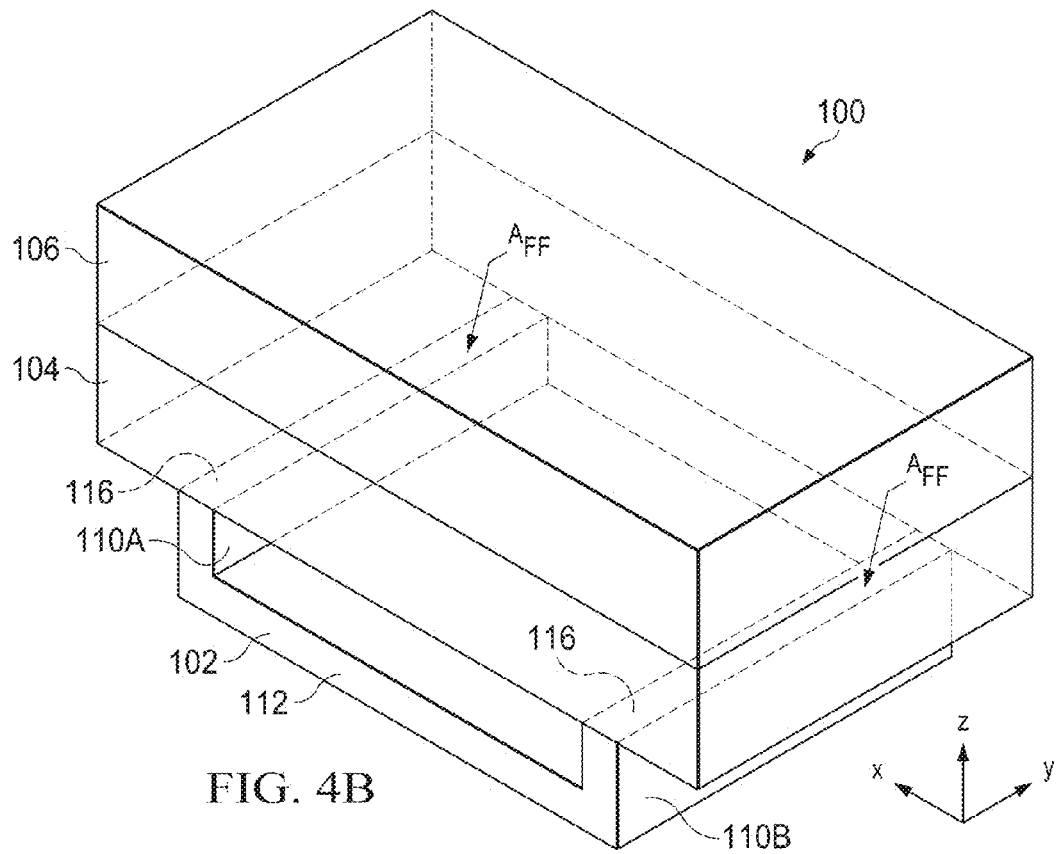

FIGS. 4A and 4B show a cross-sectional view and three-dimensional view, respectively, of a resistive memory cell 100, e.g., a CBRAM or ReRAM cell, having a trench-style bottom electrode, according to an example embodiment. Resistive memory cell 100 includes a trench-style bottom electrode 102, an electrolyte switching layer or region 104 formed above the trench-style bottom electrode 102, and a top electrode layer or region 106 formed above the electrolyte switching layer region 104. Trench-style bottom electrode 102 may be formed according to any of the techniques disclosed herein, e.g., as discussed below regarding FIGS. 11A-11F, FIGS. 12A-12F, or FIGS. 13A-13L, for example.

As shown, trench-style bottom electrode 102 has an elongated trench-like shape (elongated along the y-axis) that defines a pair of spaced-apart sidewalls 110A and 110B connected by a trench bottom region 112. The electrolyte switching region 104 may provide a path or paths for the formation of a conductive filament or vacancy chain 114 (depending on the specific type of the resistive memory cell) from each bottom electrode sidewall 110 to the top electrode region 106 when a voltage bias is applied to the cell 100, e.g., as indicated in FIG. 4B. The filament formation area $A_{FF}$ for each sidewall 110 may be defined by, or at least based on, an area of contact between an upper surface 116 of the respective sidewall 110 and the overlying switching region 104. Thus, by confining the area of contact between the bottom electrode 102 and switching region 104 to the upper surface 116 of each sidewall 110, the trench-shaped bottom electrode 102 may provide reduced sized filament formation areas, e.g., as compared with a more solid-shaped bottom electrode.

Sidewalls 110A and 110B may extend generally vertically (i.e., along the z-axis) and may have any suitable shape and/or size in the illustrated x-z plane. For example, each sidewall 110 may have a generally rectangular shape in the x-z plane, as shown in the example embodiment of FIGS. 4A and 4B. Each sidewall 110, e.g., the upper surface 116 of each sidewall 110, may be formed with any suitable width in the x-axis direction, e.g., limited only by the constraints of available thin-film trench-liner deposition technologies. For example, each sidewall 110, e.g., the upper surface 116 of each sidewall 110, may have a width of less than 100 nm in the x-axis direction. In some embodiments, each sidewall 110, e.g., the upper surface 116 of each sidewall 110, has a width of less than 30 nm in the x-axis direction. In a particular embodiment, each sidewall 110, e.g., the upper surface 116 of each sidewall 110, has a width of 20 nm±5 nm in the x-axis direction.

As another example, each sidewall 110 may be partially or fully tapered or sloped, or otherwise define a narrowed or pointed region at a top edge of the sidewall 110 to further reduce the contact area with the overlying switching region 104, e.g., by reducing the width of the sidewall upper surface 116 in the x-axis direction, and thus the filament formation area $A_{FF}$, e.g., as shown and discussed below with respect to FIGS. 12A-12F and 13A-13L.

Each of switching region 104 and top electrode region 106 may have any suitable shape and size, and may each extend over all or less than all of each bottom electrode sidewall 110A and 110B. For example, in the embodiment shown in FIGS. 4A and 4B, switching region 104 and top electrode region 106 extend over both sidewalls 110A and 110B in the x-axis direction. In other embodiments, e.g., as discussed below with respect to FIGS. 6-8, switching region 104 and/or top electrode region 106 may extend over or across only one of the two sidewalls 110A and 110B in the x-axis direction. Further, switching region 104 and top electrode region 106 may extend any selected distance in the y-axis direction. For example, in the embodiment shown in FIGS. 4A and 4B, switching region 104 and top electrode region 106 extend the full length of sidewalls 110A and 110B in the y-axis direction. In other embodiments, e.g., as discussed below with respect to FIGS. 6-10, switching region 104 and/or top electrode region 106 may extend only partially along the length of sidewalls 110A and 110B in the y-axis direction, e.g., to reduce the area of contact between each sidewall 110 and the switching region 104, thereby reducing the filament formation area $A_{FF}$.

Trench-shaped bottom electrode 102, and the region "filling" the trench, indicated as fill area 120, may be formed from any suitable materials. For example, bottom electrode 102 may be formed from Ta, Ti/TiN, W, WN, TaN, polysilicon, doped polysilicon, amorphous silicon, doped amorphous silicon, or any other suitable material, or any other conductive material, while fill area 120 may be formed from SiN, $SiO_2$, or any other generally nonconductive material. In one example embodiment, bottom electrode 102 is formed from Ta and fill area 120 is formed from SiN.

Figure 13A:
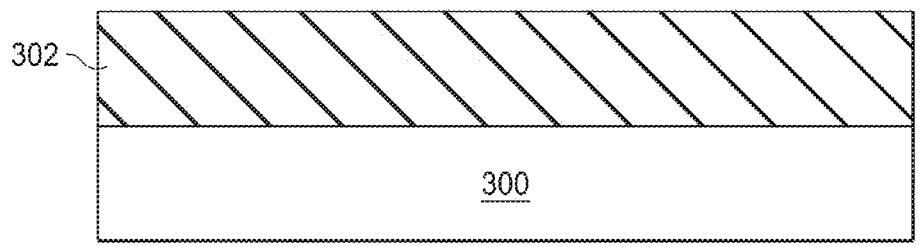
FIGS. 13A-13L illustrate another example method for forming a trench-style bottom electrode with pointed upper edges for reducing the filament formation area, according to another embodiment of the present invention.
Figure 13B:
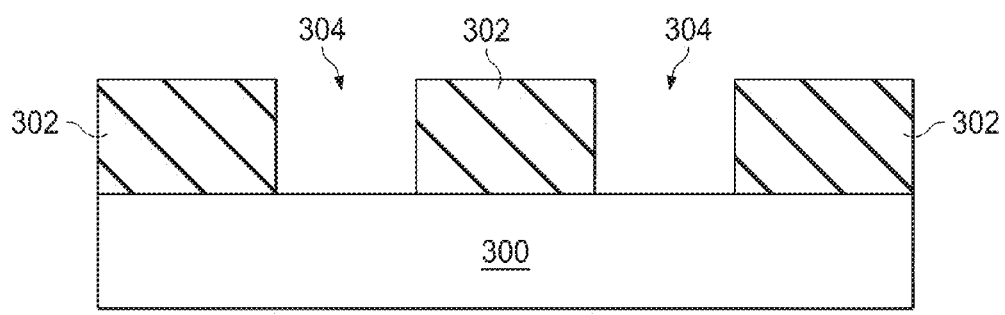
Figure 13C:
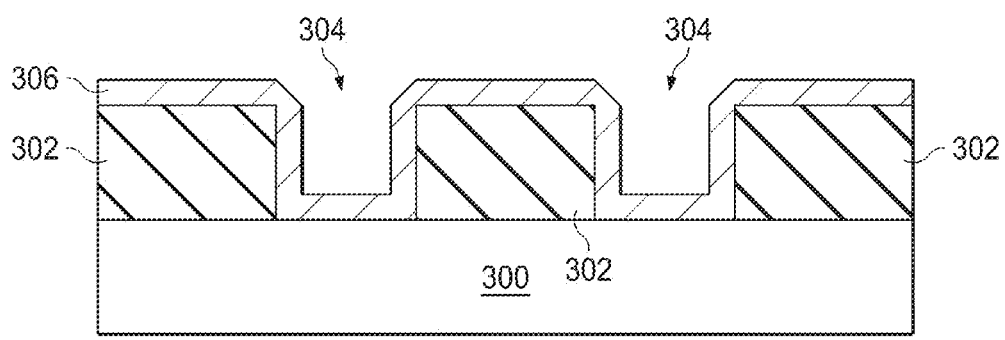
Figure 13D:
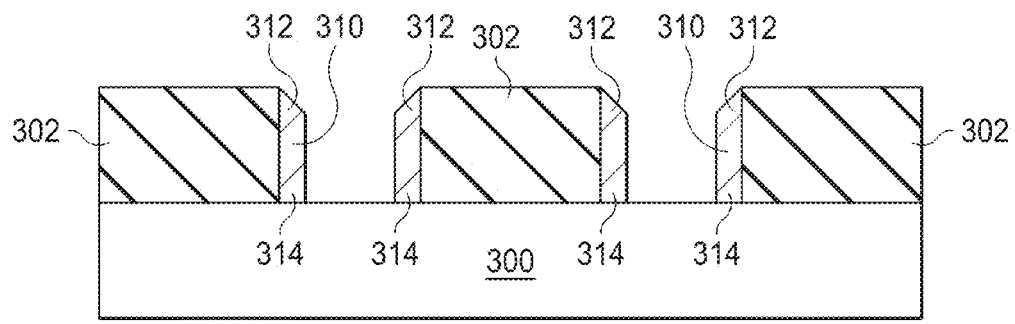
Figure 13E:
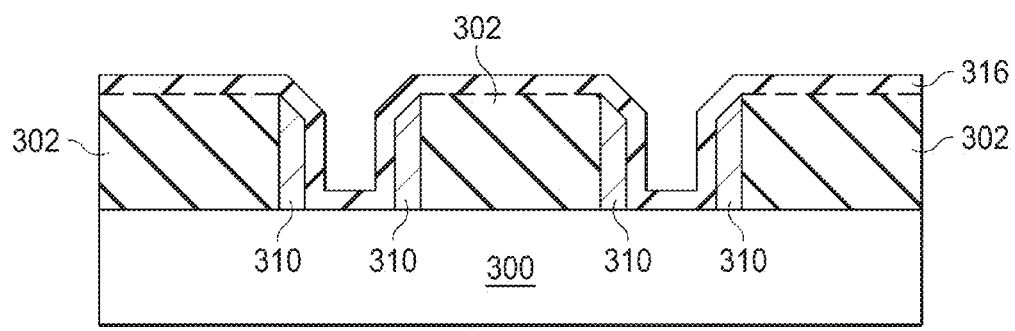
Figure 13F:
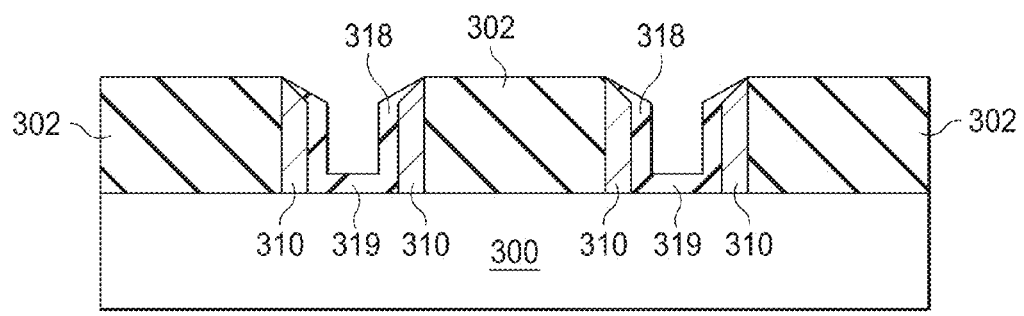
Figure 13G:
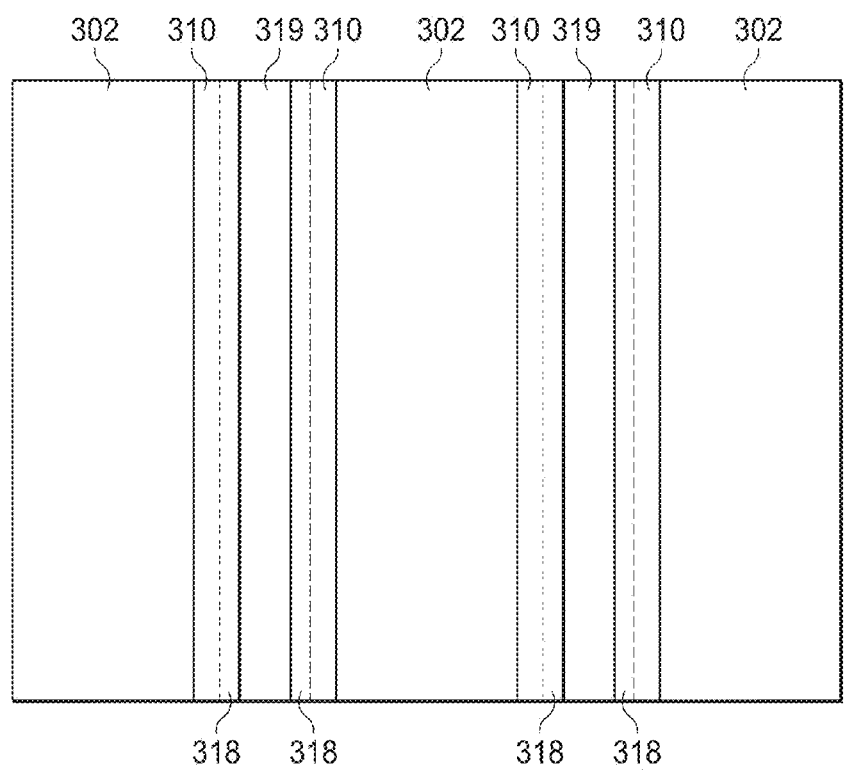
Figure 13H:
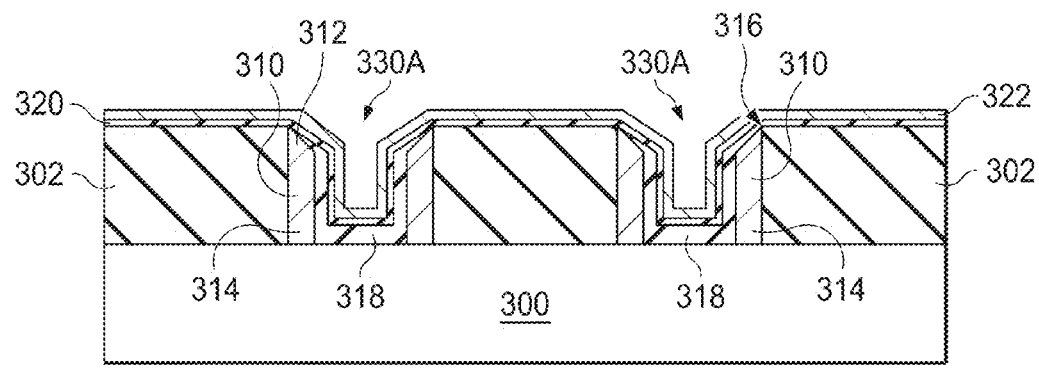
Figure 13I:
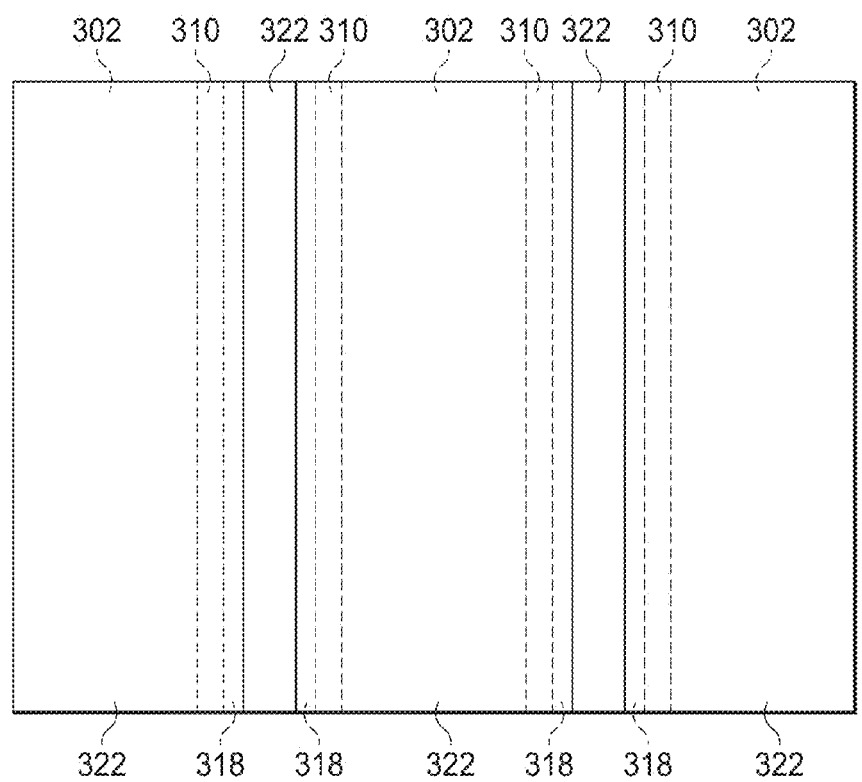
Figure 13J:
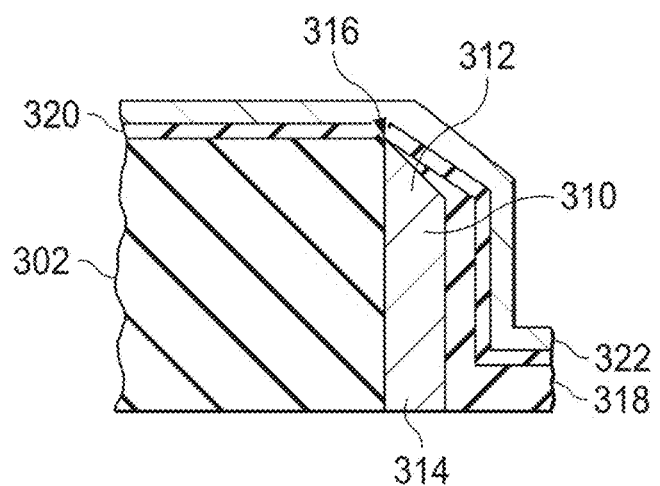
Figure 13K:
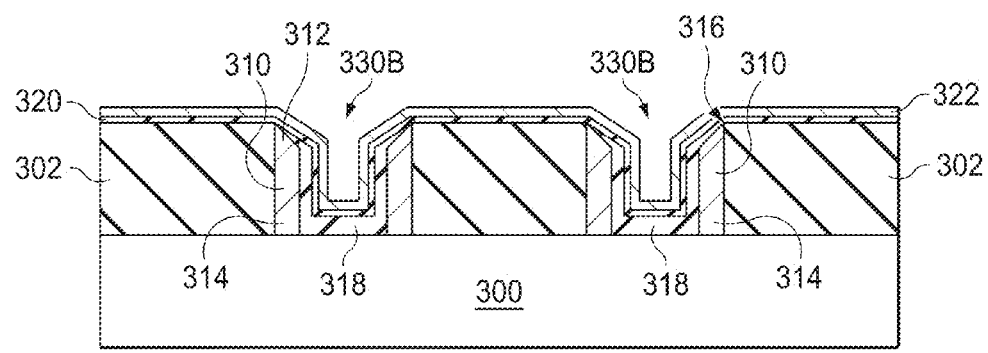
Figure 13L:
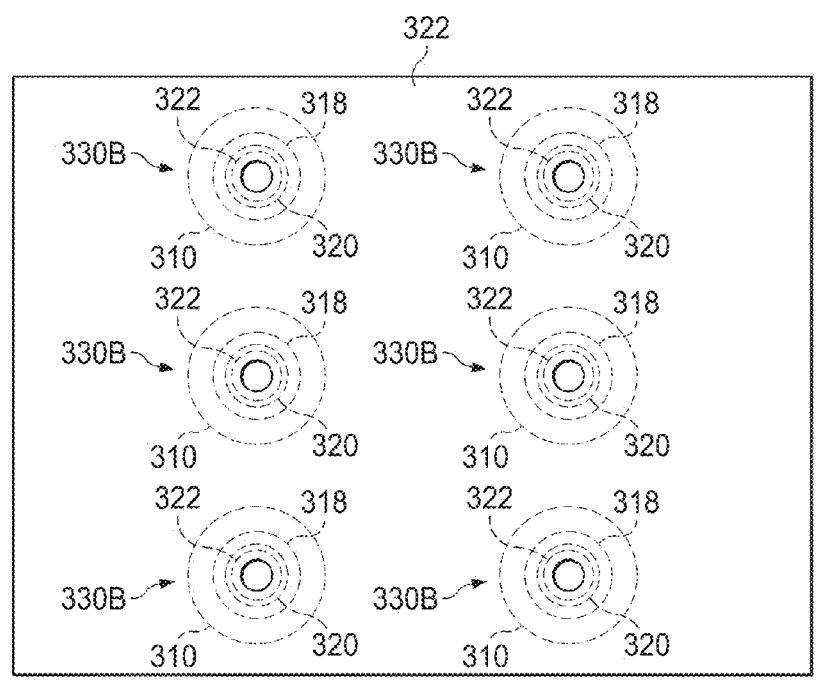

In other embodiments, instead of the elongated trench shape shown in FIGS. 4A-4B, trench-shaped bottom electrode 102 may have a via-type shape, e.g., having a rectangular, circular, oval, or any other suitable cross section (e.g., similar to the circular via-type trenches shown in FIG. 13L). In such embodiments, the via-type trench-shaped bottom electrode may define a single sidewall extending fully or partially around a perimeter (e.g., rectangular, circular, or oval perimeter) of the bottom electrode.

Figure 5A:
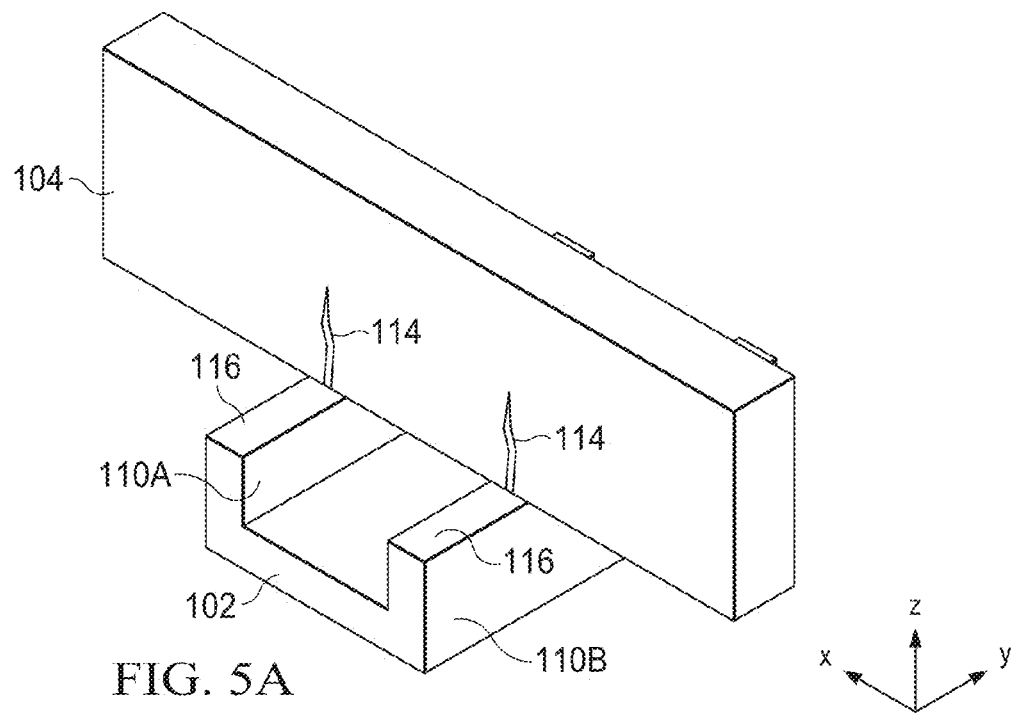
FIGS. 5A and 5B illustrate a line-style switching layer formed over a trench-style bottom electrode of a resistive memory cell, and the resulting filament formation areas, according to an example embodiment.
Figure 5B:
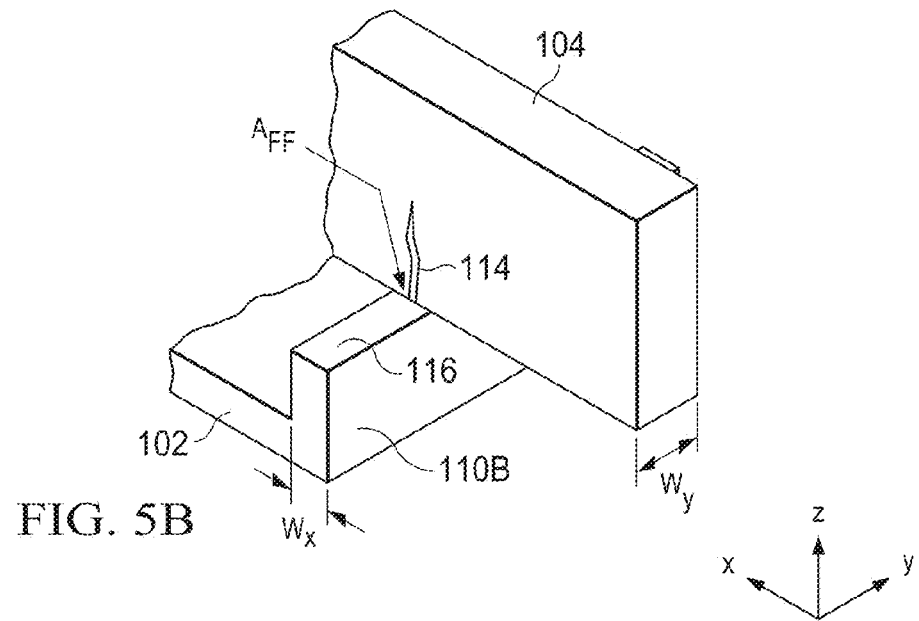

FIGS. 5A and 5B illustrate a line-style electrolyte switching layer or region 104 formed over a trench-style bottom electrode 102 of a resistive memory cell, and the resulting filament formation areas, according to an example embodiment. As shown, line-style switching region 104 has a reduced width in the y-axis direction, which provides reduced contact areas with each bottom electrode sidewall 110A and 110B (e.g., with upper surface 116 of each bottom electrode sidewall 110A and 110B). In an alternative embodiment, line-style switching region 104 may extend or cross over only one of the two sidewalls 110A and 110B.

Line-style switching region 104 may be formed with any suitable width in the y-axis direction, e.g., limited only by the constraints of available lithographic technologies. For example, switching region 104 may have a width of less than 1,000 nm in the y-axis direction. In some embodiments, switching region 104 has a width $w_y$ of less than 300 nm in the y-axis direction. In a particular embodiment, switching region 104 has a width $w_y$ of 200 nm±50 nm in the y-axis direction.

Thus, line-style switching region 104 may define a relatively small contact area with each bottom electrode sidewall 110A and/or 110B, wherein each contact area defines n filament formation area $A_{FF}$ for the formation of conductive filaments or vacancy chains 114. For example, line-style switching region 104 may define a contact area, and thus a filament formation area $A_{FF}$, of less than 10,000 nm² with each bottom electrode sidewall 110A and/or 110B. In some embodiments, line-style switching region 104 may define a filament formation area $A_{FF}$ of less than 5,000 nm² with each bottom electrode sidewall 110A and/or 110B. In a particular embodiment, line-style switching region 104 may define a filament formation area $A_{FF}$ of 4,000 nm²±1,000 nm² with each bottom electrode sidewall 110A and/or 110B.

Figure 6:
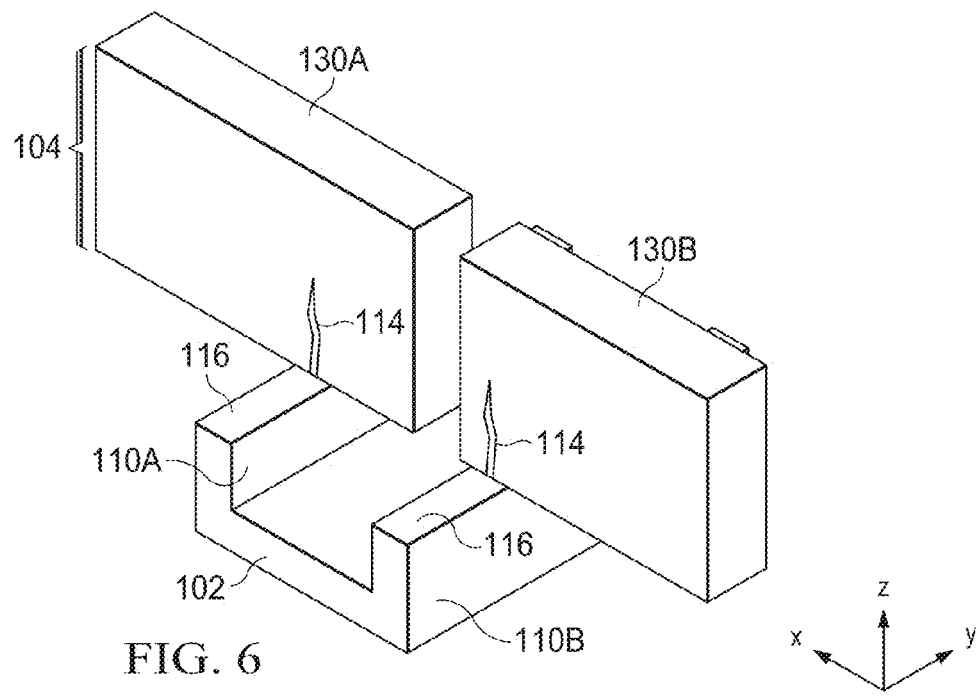
FIG. 6 illustrates a slotted line-style switching layer formed over a trench-style bottom electrode of a resistive memory cell, and the resulting filament formation areas, according to an example embodiment.

FIG. 6 illustrates a slotted line-style electrolyte switching layer 104 formed over a trench-style bottom electrode 102 of a resistive memory cell 100, and the resulting filament formation areas, according to an example embodiment. As shown, electrolyte switching layer 104 is "slotted," thus forming two spaced apart switching regions 130A and 130B, each extending over one of the two bottom electrode sidewalls 110A and 110B and forming a respective filament formation area for filaments 114. The slotted line-style electrolyte switching layer 104 may be formed using any suitable fabrication techniques or processes.

Figure 7:
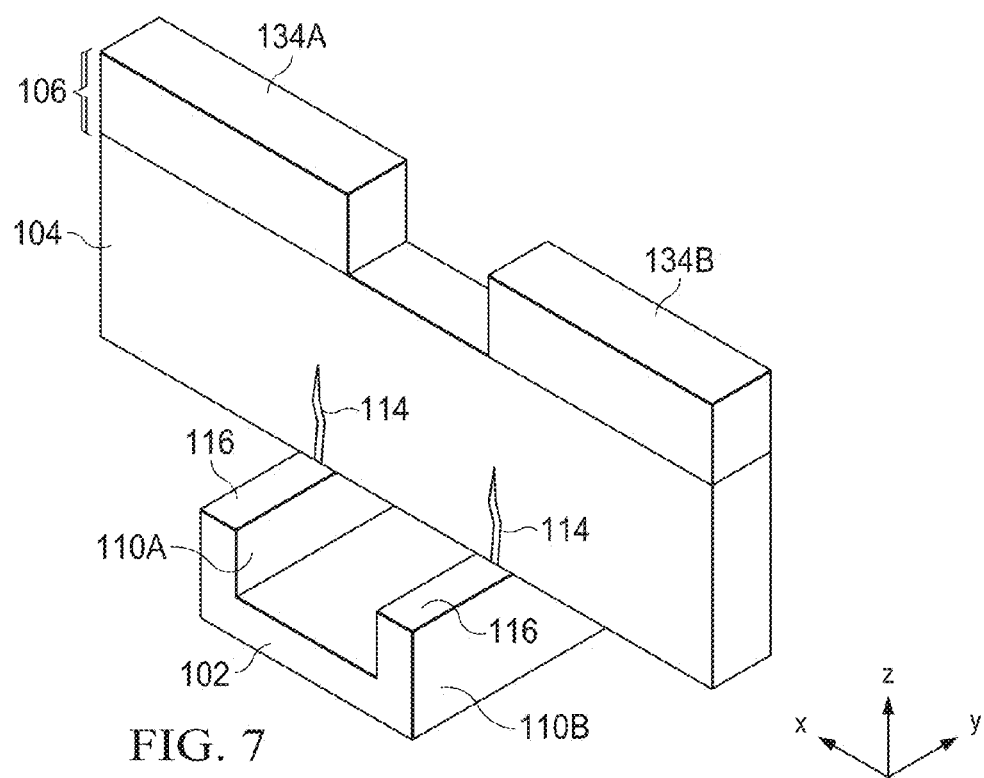
FIG. 7 illustrates a resistive memory cell structure having a trench-style bottom electrode, a line-style switching layer, and a slotted top electrode, according to an example embodiment.

FIG. 7 illustrates a resistive memory cell structure having a trench-style bottom electrode 102, a line-style electrolyte switching layer 104, and a slotted top electrode 106, according to an example embodiment. As shown, the top electrode 106 is "slotted," thus forming two spaced apart top electrode regions 134A and 134B, each extending over one of the two bottom electrode sidewalls 110A and 110B. The slotted top electrode layer 106 may be formed using any suitable fabrication techniques or processes. Electrolyte switching layer 104 may extend across both bottom electrode sidewalls 110A and 110B, as shown in FIG. 7, or alternatively may be slotted such as shown in FIG. 6, or may have any other suitable configuration.

Figure 8:
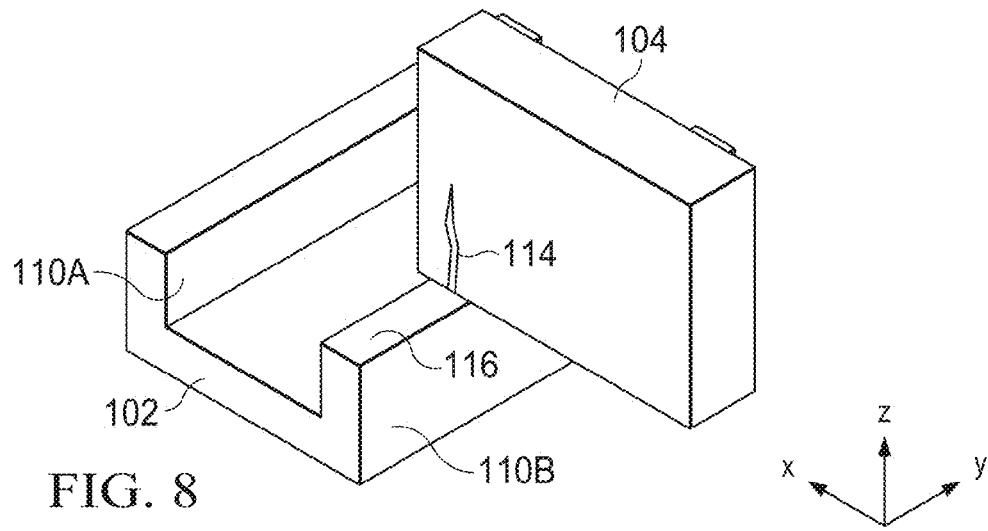
FIG. 8 illustrates a half-split line-style switching layer formed over a trench-style bottom electrode of a resistive memory cell, and the resulting single filament formation area, according to an example embodiment.

FIG. 8 illustrates a half-split line-style switching layer 104 formed over a trench-style bottom electrode 102 of a resistive memory cell, and the resulting single filament formation area, according to an example embodiment. As shown, half-split line-style switching layer 104 extends over bottom electrode sidewall 110B, but not sidewall 110A, thus forming a single respective filament formation area for filaments 114. The half-split line-style electrolyte switching layer 104 may be formed using any suitable fabrication techniques or processes.

In other embodiments, line-style switching region(s) 104 may be used in conjunction with a via-type trench-shaped bottom electrode (e.g., having a rectangular, circular, or oval shaped perimeter), rather than the elongated trench-shaped bottom electrodes shown in FIGS. 5A-8. In such embodiments, the via-type bottom electrode may have single sidewall extending around the perimeter of the bottom electrode, or may have multiple sidewalls (e.g., each extending around a portion of the bottom electrode perimeter). Further, in such embodiments, each line-style switching region may cross over each bottom electrode sidewall at one or more locations to define one or more discrete filament formation areas, $A_{FF}$. For example, a single line-style switching region may cross over a circular perimeter via-type bottom electrode at two different locations to define two discrete filament formation areas $A_{FF}$.

Figure 9A:
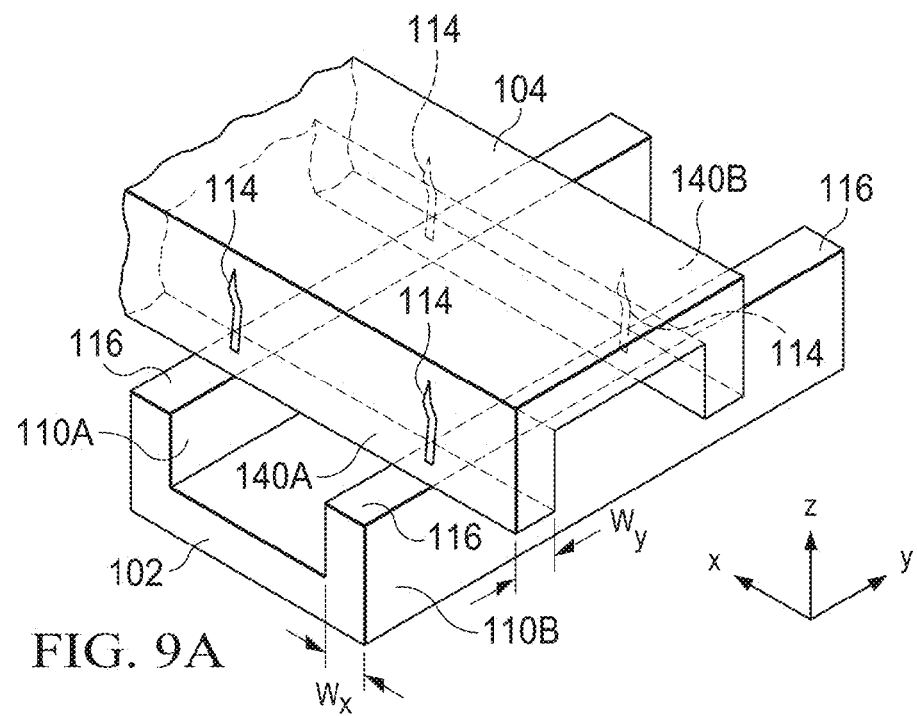
FIGS. 9A-9C illustrate an inverted-trench-style switching layer formed over a trench-style bottom electrode of a resistive memory cell, and the resulting filament formation area, according to an example embodiment.
Figure 9B:
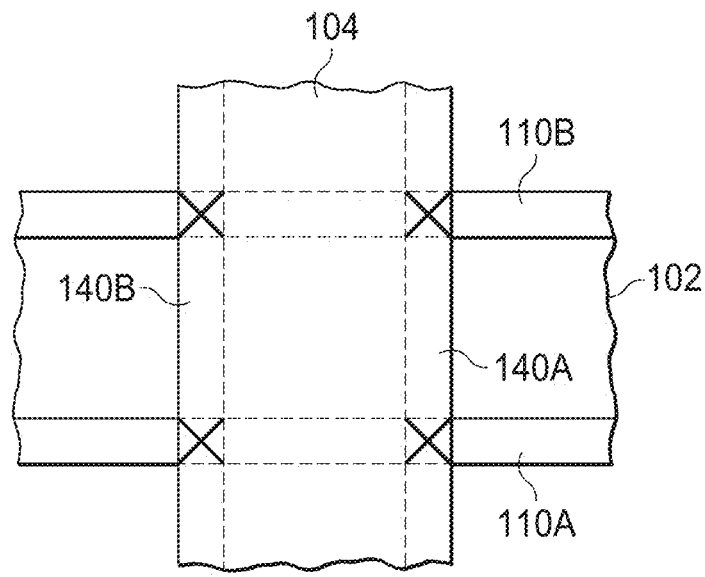
Figure 9C:
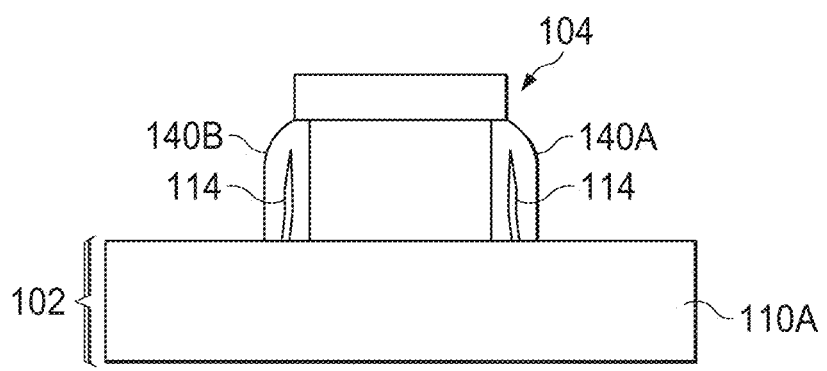

FIGS. 9A-9C illustrate an inverted-trench-style electrolyte switching region 104 formed over a trench-style bottom electrode 102 of a resistive memory cell, and the resulting filament formation areas, according to an example embodiment. Here, the electrolyte switching region 104 has an trench-shape extending perpendicular to the trench-shaped bottom electrode 102, and arranged in an inverted (or upside-down) manner with respect to the trench-shaped bottom electrode 102. The inverted-trench-style switching region 104 defines a pair of downwardly-extending sidewalls 140A and 140B, which orthogonally cross over the pair of upwardly-extending bottom electrode sidewalls 110A and 110B, thus defining four discrete contact areas between the switching region 104 and the bottom electrode 102, each contact area indicated by an "X" in FIG. 9B and defining a filament formation area for filament propagation. The inverted-trench-style electrolyte switching layer 104 may be formed using any suitable fabrication techniques or processes.

Figure 10A:
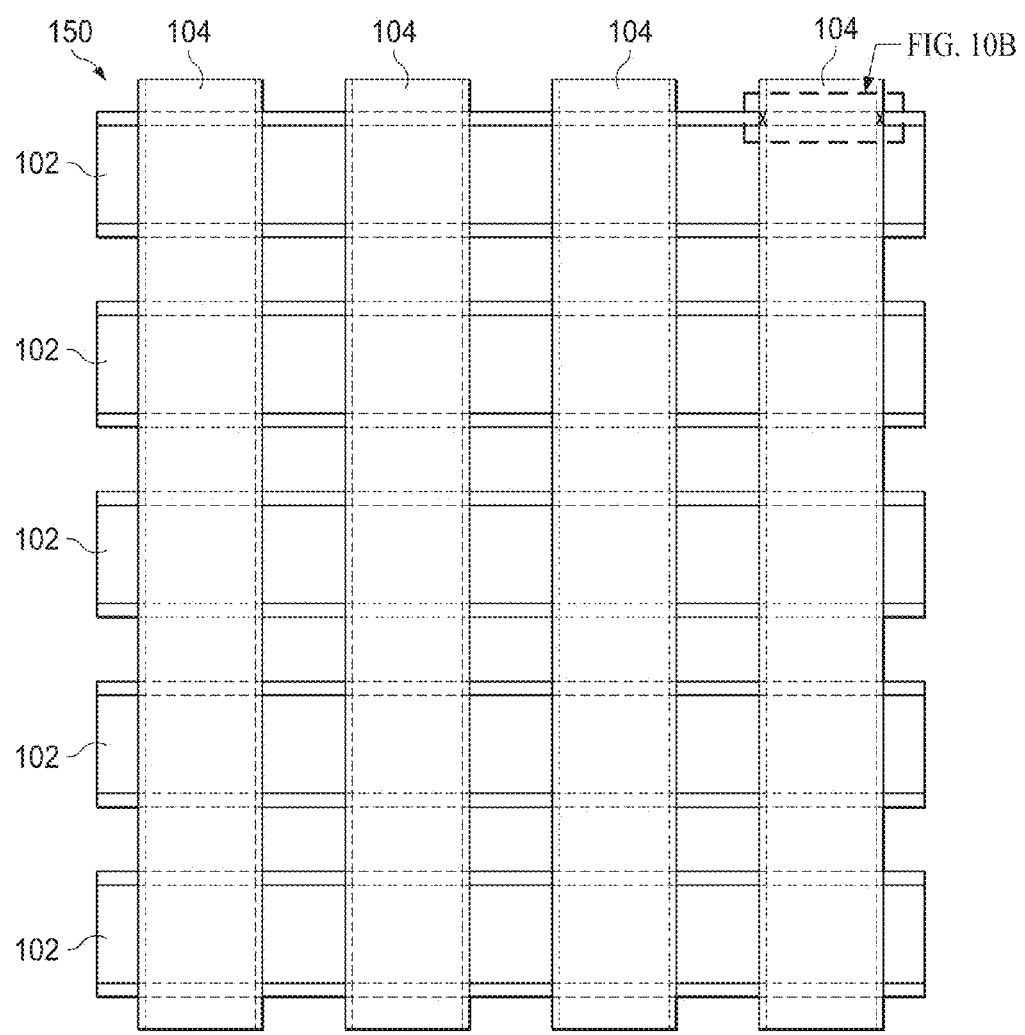
FIGS. 10A-10C illustrate a cross-point resistive memory array defined by a plurality of inverted-trench-style switching layers formed over a plurality of trench-style bottom electrodes, according to an example embodiment.
Figure 10B:
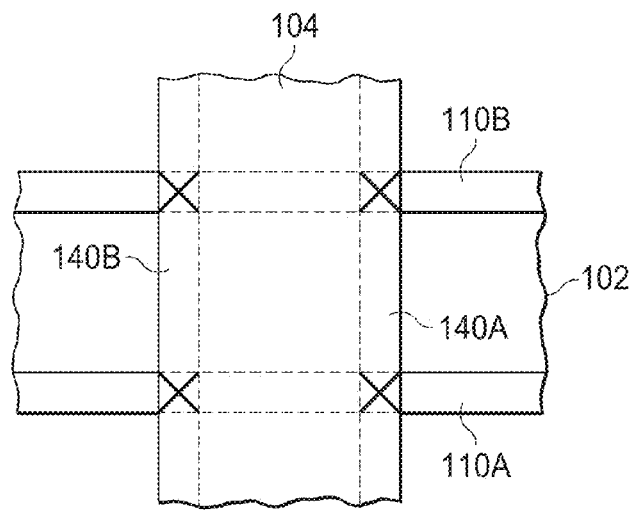
Figure 10C:
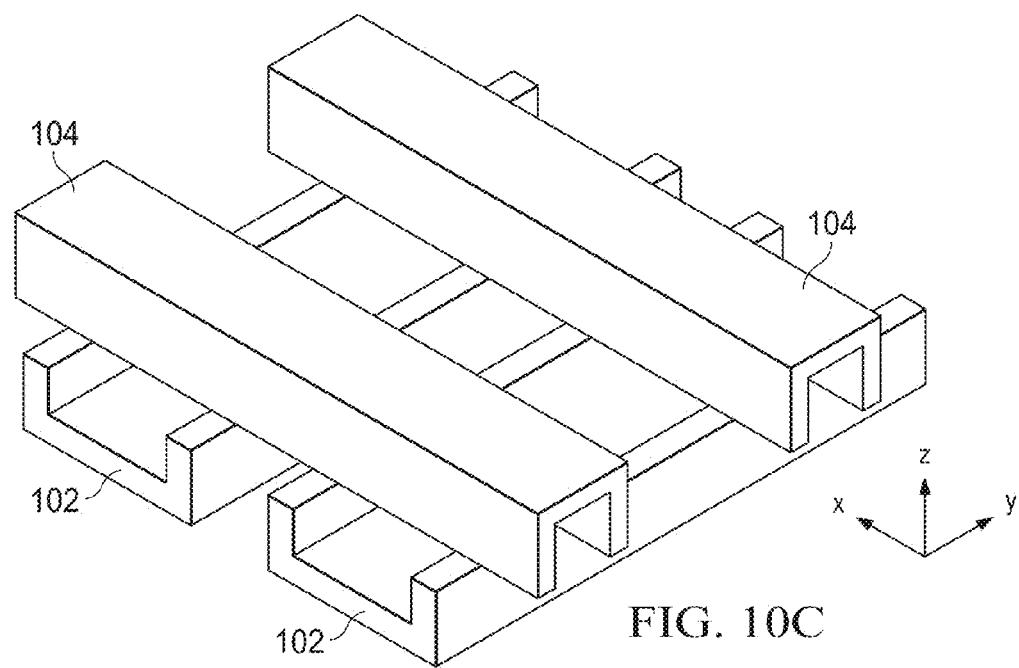

FIGS. 10A-10C illustrate an example 1R cross-point resistive memory array 150 of memory cells defined by a plurality of inverted-trench-style electrolyte switching regions 104 formed over a plurality of trench-style bottom electrodes 102, according to an example embodiment. As shown, the trench-style bottom electrodes 102 extend parallel to each other in a first direction, and the inverted-trench-style switching regions 104 extend parallel to each other and perpendicular to the bottom electrodes 102. Thus, the points of intersection between the switching region sidewalls 140 and the bottom electrode sidewalls 110 define a two-dimensional array of spaced-apart contact areas, each contact area indicated by an "X" in FIGS. 10A and 10B and defining a filament formation area for filament propagation.

As with the configurations shown in FIGS. 5A-5B, any of the configurations shown in FIGS. 6-10 may provide filament formation areas $A_{FF}$ of any selected size, e.g., limited only by the constraints of available thin-film deposition technologies. For example, any of such configurations may define individual or discrete filament formation areas $A_{FF}$ of less than 10,000 nm², or less than 5,000 nm². For example, some embodiments provide individual or discrete filament formation areas $A_{FF}$ of 4,000 nm²±1,000 nm².

FIGS. 11A-11F illustrate an example method for forming a trench-style bottom electrode for an array of resistive memory cells, e.g., CBRAM or ReRAM cells, according to an example embodiment. Each trench-style bottom electrode formed according to the techniques of FIGS. 11A-11F may have any suitable trench-type shape, e.g., an elongated trench shape, a via-type shape (e.g., having a rectangular, circular, or any other suitable cross section), or any other trench-type shape.

Figure 11A:
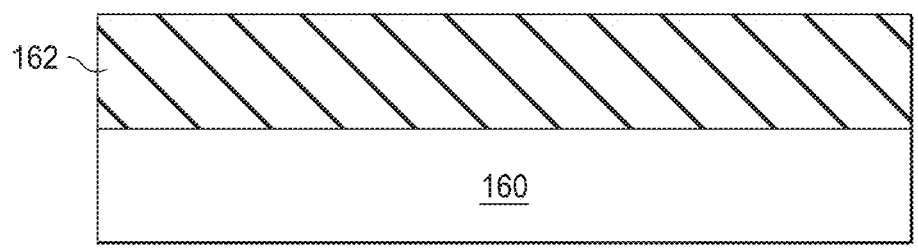
FIGS. 11A-11F illustrate an example method for forming a trench-style bottom electrode for an array of resistive memory cells, e.g., CBRAM or ReRAM cells.
Figure 11B:
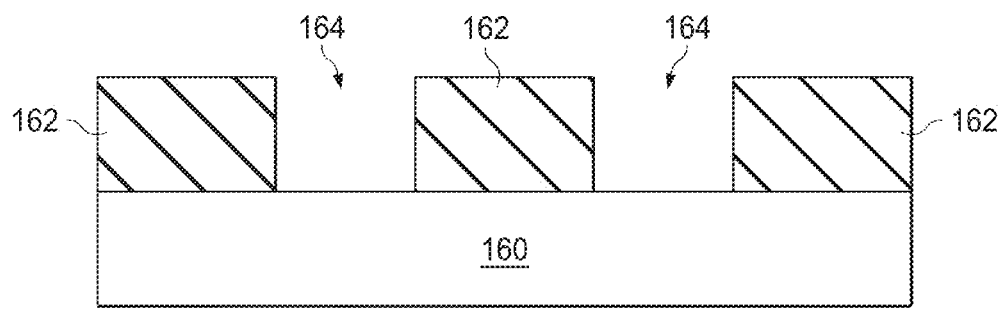

As shown in FIG. 11A, a dielectric film 162 (e.g., $SiO_2$, SiN, etc.) is formed over a substrate 160 (e.g., polysilicon, doped polysilicon, amorphous silicon, doped amorphous silicon, or any other suitable material), using any suitable technique. Next, as shown in FIG. 11B, the dielectric film 162 is patterned, e.g., using an anisotropic trench etch, to define one or more trench-shaped openings 164.

Figure 11C:
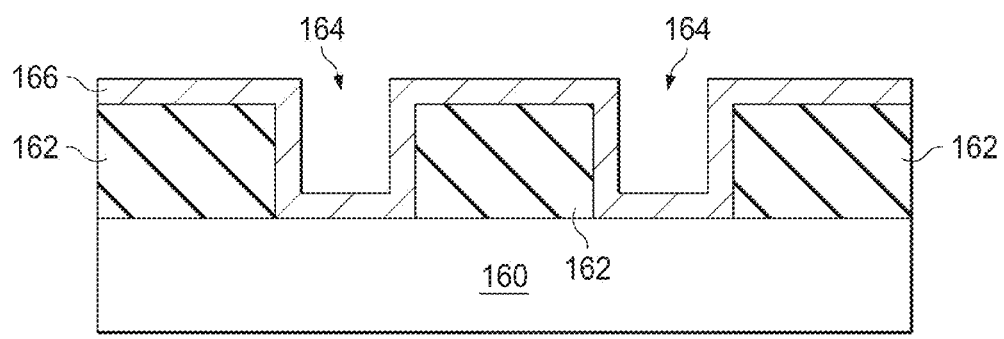

Next, as shown in FIG. 11C, a conductive trench liner 166 is deposited over the dielectric film 162, and extending into trenches 164. This conductive trench liner 166 eventually forms the trench-shaped bottom electrode after further processing, as discussed below. Trench liner 166 may comprise any suitable conductive material or materials, e.g., Ta, Ti/TiN, W, WN, TaN, polysilicon, doped polysilicon, amorphous silicon, doped amorphous silicon, or any other suitable material, and may be deposited or formed in any suitable manner.

Figure 11D:
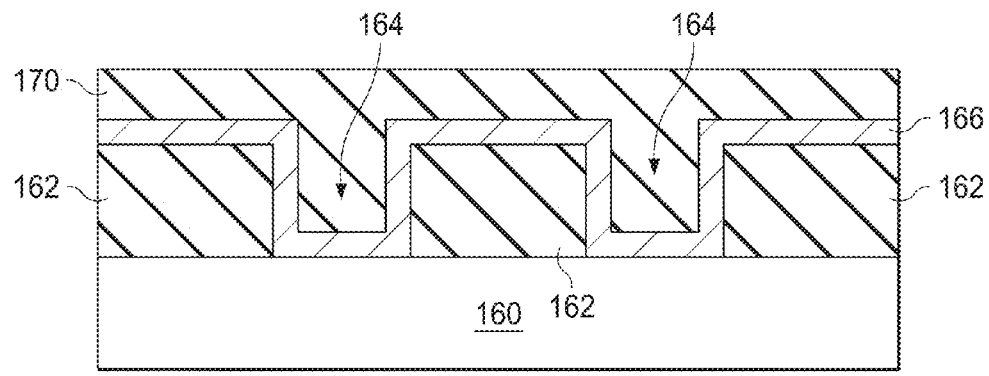

Next, as shown in FIG. 11D, a dielectric layer 170 (e.g., SiO$_2$, SiN, etc.) is deposited over the trench liner 166 and extending into trenches 164. Dielectric layer 170 may or may not comprise the same dielectric material as dielectric film 162.

Figure 11E:
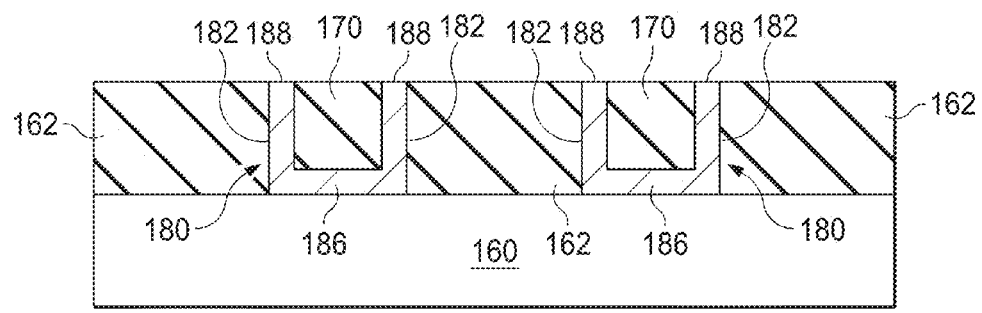

Next, as shown in FIG. 11E, a chemical-mechanical planarization (CMP) process is performed to remove upper portions of dielectric layer 170 and the trench liner 166, thus defining a trench-shaped bottom electrode 180 in each trench 164, each trench-shaped bottom electrode 180 including a pair of vertical sidewalls 182 connected by a trench bottom region 186, and filled with a remaining portion of the dielectric layer 170. The CMP process exposes an planar or generally planar upper surface 188 of each sidewall 182, which surfaces define the filament formation area A$_{FF}$ of each bottom electrode 180 in operation.

Figure 11F:
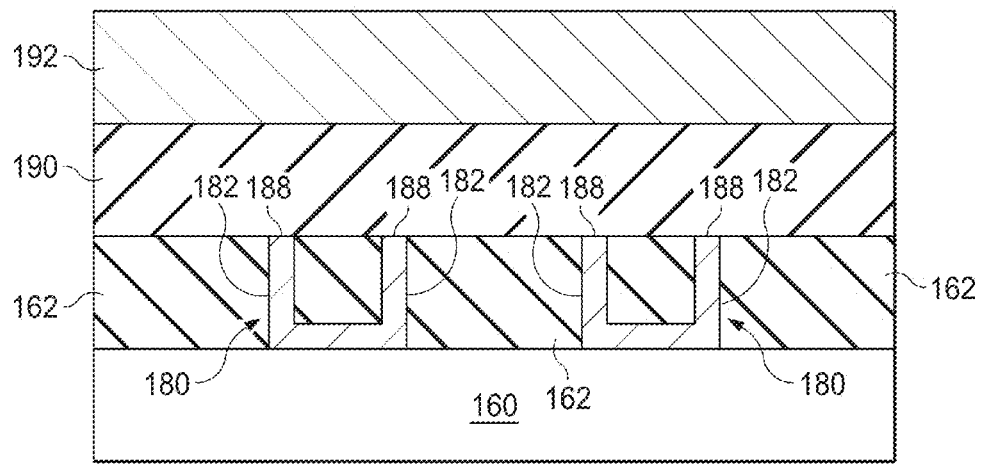

Next, as shown in FIG. 11F, an electrolyte layer, or memory film, 190 and a top electrode layer 192 are formed over the bottom electrodes 180. Electrolyte layer 190 may comprise any suitable dielectric or memristive type material or materials, for example, SiO$_x$ (e.g., SiO$_2$), GeS, CuS, TaO$_x$, TiO$_2$, Ge$_2$Sb$_2$Te$_5$, GdO, HfO, CuO, Al$_2$O$_3$, or any other suitable material. Top electrode layer 192 may comprise any suitable conductive material or materials, e.g., Ag, Al, Cu, Ta, TaN, Ti, TiN, Al, W or any other suitable material, and may be deposited or formed in any suitable manner. Layers 190 and 192 may be further patterned in any suitable manner to provide a desired memory cell structure, e.g., to define distinct top electrodes corresponding to individual bottom electrodes.

The resulting memory cell structure defines two trench-style bottom electrodes 180, each including a pair of sidewalls 182 having upper surfaces 188. Switchable memory devices are thus defined by the upper surfaces 188 of bottom electrode sidewalls 182, the adjacent top electrode 192, and the electrolyte layer 190 between the respective bottom electrode sidewall 182 and adjacent top electrode 192.

FIGS. 12A-12F illustrate an example method for forming trench-style bottom electrodes for resistive memory cells, e.g., CBRAM or ReRAM cells, wherein each trench-style bottom electrode has pointed upper edges for reducing the filament formation area, according to one embodiment. Each trench-style bottom electrode formed according to the techniques of FIGS. 12A-12F may have any suitable trench-type shape, e.g., an elongated trench shape, a via-type shape (e.g., having a rectangular, circular, or any other suitable cross section), or any other trench-type shape.

Figure 12A:
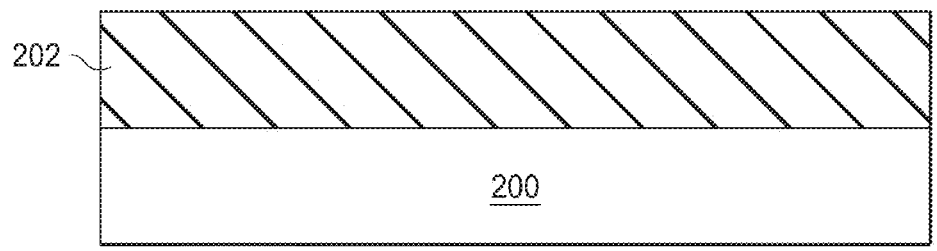
FIGS. 12A-12F illustrate another example method for forming a trench-style bottom electrode of an array of resistive memory cells, e.g., CBRAM or ReRAM cells, wherein the trench-style bottom electrode has pointed upper edges for reducing the filament formation area, according to one embodiment of the present invention.
Figure 12B:
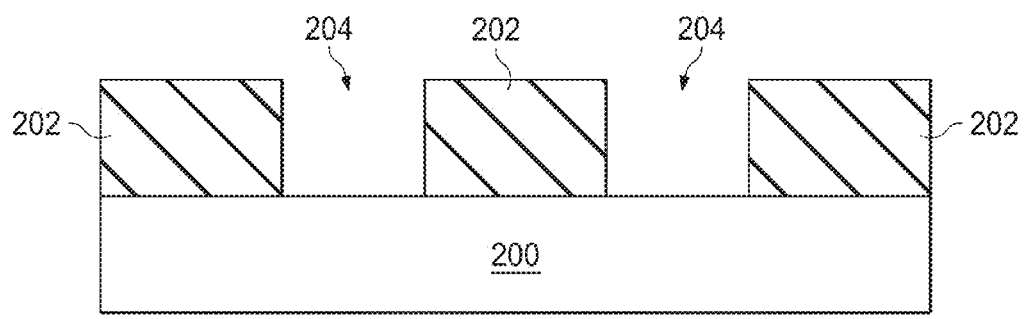

As shown in FIG. 12A, a dielectric film 202 (e.g., SiO$_2$, SiN, etc.) is formed over a bottom electrode connection 200 (e.g., polysilicon, doped polysilicon, amorphous silicon, doped amorphous silicon, or any other suitable material), using any suitable technique. Next, as shown in FIG. 12B, the dielectric film 202 is patterned, e.g., using an anisotropic trench etch, to define one or more trench-shaped openings 204.

Figure 12C:
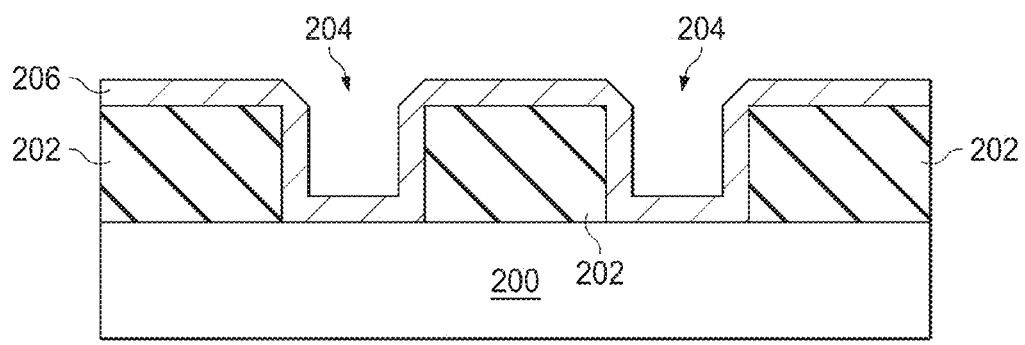

Next, as shown in FIG. 12C, a conductive layer 206 is formed over the dielectric film 202, and extending into the trench-shaped openings 204. This conductive layer 206 eventually forms the bottom electrode of the memory cell after further processing, as discussed below. Conductive layer 206 may comprise any suitable conductive material or materials, e.g., polysilicon, doped polysilicon, amorphous silicon, doped amorphous silicon, or any other suitable material (which may be the same or different than the material of bottom electrode connection 200), and may be deposited or formed in any suitable manner.

Figure 12D:
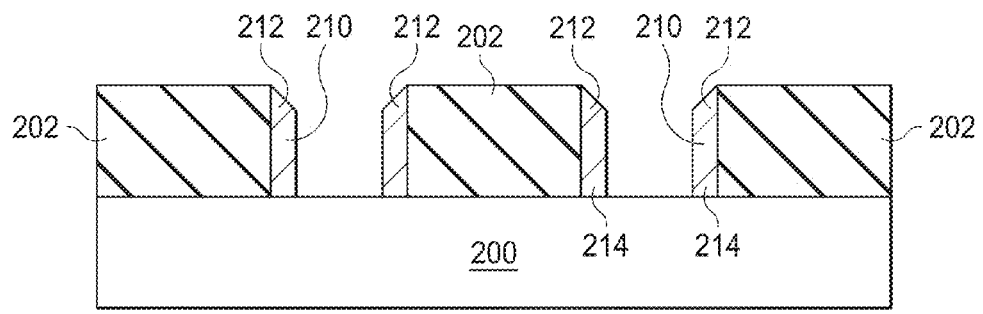

Next, as shown in FIG. 12D, conductive layer 206 is etched to at least partially remove the portion of conductive layer 206 over the remaining portions of dielectric film 202. In the illustrated example, the portions of conductive layer 206 over the remaining portions of dielectric film 202 are fully removed, thus exposing the underlying dielectric film 202, and defining a pair of sidewalls 210 in each trench. As shown, the etch process may form a sloped, curved, or angled edge at an upper region of each sidewall 210, thus defining a pointed, tapered, or otherwise reduced-thickness region, indicated as sidewall tip region 212, at an upper end of each sidewall 210, as compared to a lower sidewall region 214 adjacent the bottom electrode connection 200. The degree of the point, taper, or angle of reduced-thickness regions 212 may be determined at least in part by the type and/or parameters of the etch process. For example, a more isotropic etch may provide a sharper point for sidewall tip regions 212, while a less isotropic etch may provide a less sharp point for sidewall tip regions 212.

Figure 12E:
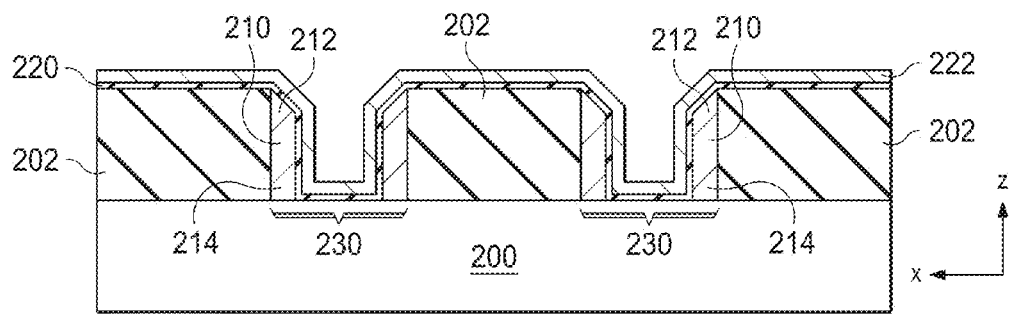

Next, as shown in FIG. 12E, an electrolyte layer 220 and a top electrode layer 222 are formed on the stack. Electrolyte layer 220 may comprise any suitable dielectric or memristive type material or materials, for example, SiO$_x$ (e.g., SiO$_2$), GeS, CuS, TaO$_x$, TiO$_2$, Ge$_2$Sb$_2$Te$_5$, GdO, HfO, CuO, Al$_2$O$_3$, or any other suitable material. Top electrode layer 222 may comprise any suitable conductive material or materials, e.g., Ag, Al, Cu, Ta, TaN, Ti, TiN, Al, W or any other suitable material, and may be deposited or formed in any suitable manner. Layers 220 and 222 may be further patterned in any suitable manner to provide a desired memory cell structure, e.g., to define distinct top electrodes corresponding to individual bottom electrodes.

The resulting memory cell structure defines two trench-style bottom electrodes 230, each including a pair of bottom electrode sidewalls 210 extending from bottom electrode connection 200, and having sidewall tip regions 212 at an upper end. Switchable memory devices are thus defined by bottom electrode sidewalls 210 (in particular the sidewall tip region 212 of each sidewall 210), the adjacent top electrode 222, and the electrolyte layer 220 between the respective bottom electrode sidewall 210 and adjacent top electrode 222.

Figure 12F:
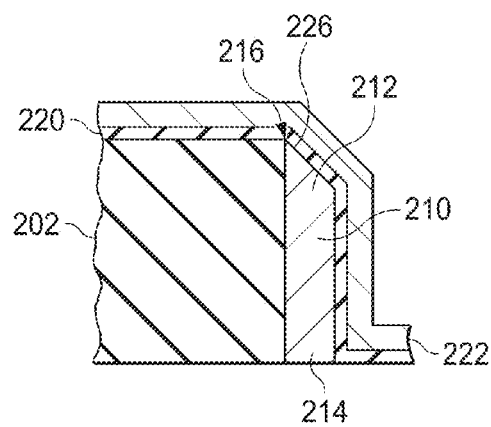

FIG. 12F shows a close-up view of a particular switchable memory device defined by the structure of FIG. 12E, showing the location of conductive filament propagation from sidewall 210 to top electrode 222, through electrolyte layer 220. As shown, the sidewall tip region 212 may define a tip surface 216 facing generally away from the bottom electrode connection 200, e.g., tip surface 216 may be an upper surface of the sidewall 210. The degree of the point, taper, or angle of reduced-thickness regions 212 may be determined at least in part by the type and/or parameters of the etch process. For example, a more isotropic etch may provide a sharper point for sidewall tip regions 212, while a less isotropic etch may provide a less sharp point for sidewall tip regions 212. A greater degree of sharpness of the sidewall tip region 212 may correspond to a smaller effective filament formation, e.g., due to a smaller width of the tip surface 216 in the x-direction.

A conductive filament is indicated at 226. In operation, conductive filament propagation from each sidewall 210 may be substantially confined to the upper surface 216 of the sidewall tip region 212, as the electric field naturally concentrates at the point or surface having the smallest radius of curvature. Thus, the sharper the point, or the smaller the thickness of sidewall tip region 212 or upper surface 216, the greater the concentration of the filament-generating electric field, and thus the smaller the effective filament formation area A$_{FF}$. In such embodiments, effective filament formation area $A_{FF}$ may or may not be defined by the area of the upper surface 216, depending on the particular geometry of the sidewall tip region 212.

In some embodiments, each bottom electrode sidewall 210 may provide an effective filament formation area $A_{FF}$, measured in a plane generally perpendicular to the direction of filament propagation, of less than 1,000 nm². In some embodiments, the effective filament formation area $A_{FF}$ is less than 100 nm². In particular embodiments, the effective filament formation area $A_{FF}$ is less than 10 nm², or even less than 1 nm². This reduced confinement zone may provide resistive memory cells (e.g., CBRAM or ReRAM cells) with more predictable and reliable filament formation, as compared with cells having a larger confinement zone. This may provide one or more of the following benefits: lower erase current, narrower distribution of low-resistance state (LRS), higher on/off ratio (HRS/LRS), and improved failure rates.

FIGS. 13A-13L illustrate another example method for forming trench-style bottom electrodes for resistive memory cells, e.g., CBRAM or ReRAM cells, wherein each trench-style bottom electrode has pointed upper edges for reducing the filament formation area, according to another embodiment. Each trench-style bottom electrode formed according to the techniques of FIGS. 13A-13L may have any suitable trench-type shape, e.g., an elongated trench shape (e.g., as discussed below with reference to FIGS. 13G and 13I); a via-type shape, e.g., having a rectangular, circular, or any other suitable cross section (e.g., as discussed below with reference to FIG. 13L); or any other trench-type shape.

As shown in FIG. 13A, a dielectric film 302 (e.g., SiO₂, SiN, etc.) is formed over a bottom electrode connection 300 (e.g., polysilicon, doped polysilicon, amorphous silicon, doped amorphous silicon, or any other suitable material), using any suitable technique. Next, as shown in FIG. 13B, the dielectric film 302 is patterned, e.g., using an anisotropic trench etch, to define one or more trench-shaped openings 304.

Next, as shown in FIG. 13C, a conductive layer 306 is formed over the dielectric film 302, and extending into the trench-shaped openings 304. This conductive layer 306 eventually forms the bottom electrode of the memory cell after further processing, as discussed below. Conductive layer 306 may comprise any suitable conductive material or materials, e.g., polysilicon, doped polysilicon, amorphous silicon, doped amorphous silicon, or any other suitable material (which may be the same or different than the material of bottom electrode connection 300), and may be deposited or formed in any suitable manner.

Next, as shown in FIG. 13D, conductive layer 306 is etched to at least partially remove the portion of conductive layer 306 over the remaining portions of dielectric film 302. In the illustrated example, the portions of conductive layer 306 over the remaining portions of dielectric film 302 are fully removed, thus exposing the underlying dielectric film 302, and defining a pair of sidewalls 310 in each trench. As shown, the etch process may form a sloped, curved, or angled edge at an upper surface of each sidewall 310, thus defining a pointed, tapered, or otherwise reduced-thickness region, indicated as sidewall tip region 312, at an upper end of each sidewall 310. As shown, the etch process may form a sloped, curved, or angled edge at an upper region of each sidewall 310, thus defining a pointed, tapered, or otherwise reduced-thickness region, indicated as sidewall tip region 312, at an upper end of each sidewall 310, as compared to a lower sidewall region 314 adjacent the bottom electrode connection 300. The degree of the point, taper, or angle of sidewall tip regions 312 may be determined at least in part by the type and/or parameters of the etch process. For example, a more isotropic etch may provide a sharper point for sidewall tip regions 312, while a less isotropic etch may provide a less sharp point for sidewall tip regions 312.

Next, as shown in FIG. 13E, a dielectric spacer layer 316 (e.g., SiO₂, SiN, etc.) is deposited or formed over the stack, using any suitable technique. Dielectric spacer layer 316 may comprise the same or different material(s) as dielectric layer 302, depending on the embodiment. Dielectric spacer layer 316 may act as an additional spacer to isolate the bottom electrode sidewalls 310, and provide a dielectric above the bottom electrode connection 300 at the base of each trench opening.

Next, as shown in FIG. 13F, dielectric spacer layer 316 is etched to remove the thickness of layer 316 outside of the trench openings, while leaving a portion of the thickness of layer 316 above the top surface of bottom electrode connection 300 within the trench openings, using any suitable etching techniques. As shown, the remaining portions of dielectric spacer layer 316 define sidewall insulating regions 318 adjacent each bottom electrode sidewall 310, and a trench bottom insulating region 319 over the bottom electrode connection 300 within each trench openings. In an alternative embodiment, the etch process may remove the full thickness of dielectric spacer layer 316 within the trench openings, thus exposing the top surface of bottom electrode connection 300.

FIG. 13G is a view from above of the structure shown in FIG. 13F, in an embodiment in which the trench-style bottom electrodes are formed as elongated trenches (e.g., as opposed to via-type trenches shown in FIG. 13L, discussed below).

Next, as shown in FIG. 13H, an electrolyte layer 320 and a top electrode layer 322 are formed on the stack. Electrolyte layer 320 may comprise any suitable dielectric or memristive type material or materials, for example, $SiO_x$ (e.g., $SiO_2$), GeS, CuS, $TaO_x$, $TiO_2$, $Ge_2Sb_2Te_5$, GdO, HfO, CuO, $Al_2O_3$, or any other suitable material. Top electrode layer 322 may comprise any suitable conductive material or materials, e.g., Ag, Al, Cu, Ta, TaN, Ti, TiN, Al, W or any other suitable material, and may be deposited or formed in any suitable manner. Layers 320 and 322 may be further patterned in any suitable manner to provide a desired memory cell structure, e.g., to define distinct top electrodes corresponding to individual bottom electrodes.

FIG. 13I is a semi-transparent top view of the structure shown in FIG. 13H (semi-transparent to show the bottom electrode structure), in an embodiment in which the trench-style bottom electrodes are formed as elongated trenches (e.g., as opposed to via-type trenches shown in FIG. 13L, discussed below).

As shown in FIG. 13H, the memory cell structure defines two trench-style bottom electrodes 330A, each including a pair of bottom electrode sidewalls 310 extending from bottom electrode connection 300, and having sidewall tip regions 312 at an upper end. Switchable memory devices are thus defined by bottom electrode sidewalls 310 (in particular the sidewall tip region 312 of each sidewall 310), the adjacent top electrode 322, and the electrolyte layer 320 between the respective bottom electrode sidewall 310 and adjacent top electrode 322.

FIG. 13J shows a close-up view of a particular switchable memory device defined by the structure of FIG. 13H, showing the conductive filament propagation path from tip region 316 of sidewall 310 to top electrode 322, through electrolyte layer 320. Similar to the embodiment discussed above with reference to FIG. 12F, in the present embodiment conductive filament propagation from each sidewall 310 is substantially confined to an upper surface 316 or tip of the sidewall tip region 312, as the electric field naturally concentrates at the point or surface having the smallest radius of curvature. Thus, the sharper the point, or the smaller the thickness of sidewall tip region 312 or upper surface 316, the greater the concentration of the filament-generating electric field, and thus the smaller the effective filament formation area $A_{FF}$. In addition, the addition of the sidewall insulating regions 318 may provide additional concentration of the filament-generating electric field and thus reduction of the width of upper surface 316 and/or the effective filament formation area $A_{FF}$, e.g., as compared to the embodiment of FIG. 12F.

In some embodiments, each bottom electrode sidewall 310 may provide an effective filament formation area $A_{FF}$, measured in a plane generally perpendicular to the direction of filament propagation, of less than 1,000 nm². In some embodiments, the effective filament formation area $A_{FF}$ is less than 100 nm². In particular embodiments, the effective filament formation area $A_{FF}$ is less than 10 nm², or even less than 1 nm². This reduced confinement zone may provide resistive memory cells (e.g., CBRAM or ReRAM cells) with more predictable and reliable filament formation, as compared with cells having a larger confinement zone. This may provide one or more of the following benefits: lower erase current, narrower distribution of low-resistance state (LRS), higher on/off ratio (HRS/LRS), and improved failure rates.

FIGS. 13K and 13L illustrate a cross-sectional view and semi-transparent top view (semi-transparent to show the bottom electrode structure) of an embodiment in which the trench-style bottom electrodes 330B are formed as circular via-type trenches (e.g., as opposed to elongated trenches shown in FIGS. 13G and 13I, discussed above). As shown in FIG. 13K, the cross-section may be similar to that of the elongated trench shaped embodiment of FIGS. 13G and 13I. However, the top view shown in FIG. 13L clearly shows the circular via shape of the bottom trench electrodes 330B. In particular, FIG. 13L shows a 2×3 array of circular via shaped bottom trench electrodes 330B.

Although the disclosed embodiments are described in detail in the present disclosure, it should be understood that various changes, substitutions and alterations can be made to the embodiments without departing from their spirit and scope.

The invention claimed is:

1. A resistive memory cell, comprising:
   a top electrode;
   a bottom electrode structure having a trench shape and defining a bottom electrode connection and a bottom electrode sidewall extending from the bottom electrode connection and defining an interior trench area;
   wherein the bottom electrode sidewall extends from a top surface of the bottom electrode connection to a tip region defining a tip surface facing generally away from the bottom electrode connection;
   wherein the bottom electrode sidewall adjacent the bottom electrode connection has a first sidewall region thickness in a first direction, and the tip surface facing away from the bottom electrode connection has a tip thickness in the first direction that is less than the first sidewall region thickness; and
   an electrolyte layer defining an electrolyte switching region arranged between the top electrode and the tip region of the bottom electrode sidewall and at least a portion of the electrolyte layer extends into the interior trench area, wherein the electrolyte layer provides a path for the formation of a conductive filament or vacancy chain from the tip surface of the bottom electrode sidewall to the top electrode, via the electrolyte switching region, when a voltage bias is applied to the resistive memory cell, wherein an insulating layer is arranged between the electrolyte layer and a surface of the bottom electrode sidewall facing the interior trench area.

2. The resistive memory cell according to claim 1, wherein the resistive memory cell is a conductive bridging memory (CBRAM) cell.

3. The resistive memory cell according to claim 1, wherein the resistive memory cell is a resistive RAM (ReRAM) cell.

4. The resistive memory cell according to claim 1, wherein the trench shape of the bottom electrode structure is an elongated trench shape defining a pair of spaced-apart bottom electrode sidewalls extending away from the bottom electrode connection, each bottom electrode sidewall having a tip region defining a tip surface facing away from the bottom electrode connection.

5. The resistive memory cell according to claim 1, wherein the trench shape of the bottom electrode structure is a via-type trench shape defining a perimeter, wherein the bottom electrode sidewall, including the tip surface, extends around the perimeter of the via-type trench shape.

6. The resistive memory cell according to claim 5, wherein the perimeter of the via-type shape is circular, oval, or rectangular in shape.

7. The resistive memory cell according to claim 1, wherein the tip region of the bottom electrode sidewall defines a tapered shape decreasing in thickness along a direction away from the bottom electrode connection.

8. The resistive memory cell according to claim 1, wherein:
   at least a portion of the electrolyte layer is arranged in direct contact with the tip surface of the bottom electrode sidewall.

9. The resistive memory cell according to claim 1, wherein:
   the insulating layer covers a surface of the bottom electrode connection facing the interior trench area.

10. The resistive memory cell according to claim 1, wherein:
    the trench shape of the bottom electrode structure defines a pair of opposing bottom electrode sidewalls; and
    the electrolyte switching region comprises an elongated line-shaped region extending across the pair of bottom electrode sidewalls.

11. The resistive memory cell according to claim 1, wherein:
    a contact area between the electrolyte region and the bottom electrode sidewall is less than 100 nm².

12. The resistive memory cell according to claim 11, wherein the contact area is less than 10 nm².

13. A method of forming a resistive memory cell, comprising:
    forming a bottom electrode connection;
    forming a bottom electrode structure having a trench shape by a process including:
      forming a sidewall support structure over the bottom electrode connection, the sidewall support structure defining a trench shaped opening;
      depositing a bottom electrode sidewall layer over the sidewall support structure and extending into the trench shaped opening; and
      etching the bottom electrode sidewall layer to remove portions of the bottom electrode sidewall layer, and to define a bottom electrode sidewall extending from a first sidewall region adjacent the bottom electrode connection to a tip region away from the bottom electrode connection;

wherein the etching step provides that the tip surface has a thickness in a first direction that is less than a thickness of the first sidewall region in the first direction;

forming an insulating layer over the trench-shaped bottom electrode such that the insulating layer covers a surface of the bottom electrode sidewall facing the interior trench area; and forming an electrolyte region and a top electrode such that the electrolyte region is arranged between the top electrode and the tip region of the bottom electrode sidewall and such that at least a portion of the electrolyte layer extends into the interior trench area, the electrolyte region being configured to provide a path for the formation of a conductive filament or vacancy chain from the tip surface of the bottom electrode sidewall to the top electrode, via the electrolyte switching region, when a voltage bias is applied to the resistive memory cell.

14. The method of claim 13, wherein:
the electrolyte layer is arranged in direct contact with the tip region of the bottom electrode sidewall.

15. The method of claim 13, wherein the sidewall support structure and the insulating layer are formed from the same or different dielectric materials.

16. The method of claim 13, wherein:
the insulating layer is arranged between the electrolyte layer and a surface of the bottom electrode connection facing the interior trench area.

17. The method of claim 13, wherein the trench shape of the bottom electrode structure is an elongated trench shape defining a pair of spaced-apart bottom electrode sidewalls extending away from the bottom electrode connection, each bottom electrode sidewall having a tip region defining a tip surface facing away from the bottom electrode connection.

18. The method of claim 13, wherein the trench shape of the bottom electrode structure is a via-type trench shape defining a perimeter, wherein the bottom electrode sidewall, including the tip surface, extends around the perimeter of the via-type trench shape.

19. The method of claim 18, wherein the perimeter of the via-type shape is circular, oval, or rectangular in shape.

20. The method of claim 13, wherein the etching step provides that the tip region of the bottom electrode sidewall defines a tapered shape decreasing in thickness along a direction away from the bottom electrode connection.

21. The method according to claim 13, wherein:
a contact area between the electrolyte region and the bottom electrode sidewall is less than 100 $nm^2$.

22. The method according to claim 21, wherein the contact area is less than 10 $nm^2$.

23. The method according to claim 21, wherein the contact area is less than 1 $nm^2$.

24. The resistive memory cell according to claim 11, wherein the contact area is less than 1 $nm^2$.

* * * * *